United States Patent
Bush et al.

(10) Patent No.: US 12,094,663 B2
(45) Date of Patent: Sep. 17, 2024

(54) BYPASS DIODE INTERCONNECT FOR THIN FILM SOLAR MODULES

(71) Applicant: Swift Solar Inc., Redwood City, CA (US)

(72) Inventors: Kevin Alexander Bush, San Francisco, CA (US); Giles Eperon, Arvada, CO (US)

(73) Assignee: Swift Solar Inc., San Carlos, CA (US)

( * ) Notice: Subject to any disclaimer, the term of this patent is extended or adjusted under 35 U.S.C. 154(b) by 176 days.

(21) Appl. No.: 17/658,302

(22) Filed: Apr. 7, 2022

(65) Prior Publication Data

US 2023/0096010 A1    Mar. 30, 2023

Related U.S. Application Data

(60) Provisional application No. 63/250,970, filed on Sep. 30, 2021.

(51) Int. Cl.
*H01G 9/20* (2006.01)
*H01L 31/0443* (2014.01)

(52) U.S. Cl.
CPC ......... *H01G 9/2081* (2013.01); *H01G 9/2009* (2013.01); *H01L 31/0443* (2014.12)

(58) Field of Classification Search
CPC . H01L 31/0443; H01G 9/2081; H01G 9/2009
See application file for complete search history.

(56) References Cited

U.S. PATENT DOCUMENTS

| | | |
|---|---|---|
| 4,956,023 A | 9/1990 | Tsuge et al. |
| 6,690,041 B2 | 2/2004 | Armstrong et al. |
| 10,644,179 B1 | 5/2020 | Bush |
| 11,329,177 B2 | 5/2022 | Bush |
| 2001/0023702 A1 | 9/2001 | Nakagawa et al. |
| 2002/0144724 A1 | 10/2002 | Kilmer et al. |
| 2002/0164834 A1 | 11/2002 | Boutros et al. |
| 2005/0121068 A1 | 6/2005 | Sager et al. |
| 2010/0282291 A1 | 11/2010 | Goto et al. |

(Continued)

FOREIGN PATENT DOCUMENTS

| | | |
|---|---|---|
| CN | 102637700 A | 8/2012 |
| EP | 1443566 A1 | 8/2004 |

(Continued)

OTHER PUBLICATIONS

PCT/US2022/076871, "PCT Notification of Transmittal of the International Search Report and the Written Opinion of the International Searching Authority, or the Declaration", Mailed Jan. 20, 2023, 9 pages.

(Continued)

*Primary Examiner* — Kourtney R S Carlson
(74) *Attorney, Agent, or Firm* — Aikin & Gallant, LLP

(57) ABSTRACT

Solar cell interconnect with bypass diodes are described. In an embodiment, a semiconductor-based bypass layer is formed over a top electrode layer of a solar cell and spans over a vertical interconnect providing vertical interconnection between the bottom electrode layer and top electrode layer of serial solar cells. A bypass electrode layer is formed over the semiconductor-based bypass layer and in contact with the top electrode layer for one of the solar cells.

21 Claims, 14 Drawing Sheets

(56) References Cited

U.S. PATENT DOCUMENTS

| | | |
|---|---|---|
| 2011/0023954 A1 | 2/2011 | Jung |
| 2011/0265857 A1 | 11/2011 | Wang et al. |
| 2011/0284986 A1 | 11/2011 | Rim et al. |
| 2012/0015472 A1 | 1/2012 | Hayashi et al. |
| 2012/0055544 A1 | 3/2012 | Ahn et al. |
| 2013/0008496 A1 | 1/2013 | Jee |
| 2014/0261657 A1 | 9/2014 | Cheng et al. |
| 2014/0261674 A1 | 9/2014 | Youngbull et al. |
| 2015/0007866 A1 | 1/2015 | Karst et al. |
| 2015/0020864 A1 | 1/2015 | Dufoureq et al. |
| 2015/0228415 A1 | 8/2015 | Seok et al. |
| 2016/0087233 A1 | 3/2016 | Guha et al. |
| 2016/0196927 A1 | 7/2016 | Bryant et al. |
| 2016/0233439 A1 | 8/2016 | Burschka et al. |
| 2017/0033304 A1 | 2/2017 | Yamamoto et al. |
| 2017/0077344 A1 | 3/2017 | Youngbull et al. |
| 2017/0077402 A1 | 3/2017 | Oooka et al. |
| 2017/0194102 A1 | 7/2017 | Huang et al. |
| 2018/0174761 A1 | 6/2018 | Kamino et al. |
| 2019/0074461 A1 | 3/2019 | Ding et al. |
| 2020/0152394 A1 | 5/2020 | Bush |
| 2020/0152812 A1 | 5/2020 | Bush |
| 2020/0295209 A1* | 9/2020 | Bush .................. H01L 31/0443 |

FOREIGN PATENT DOCUMENTS

| | | | |
|---|---|---|---|
| EP | 2224495 A1 | | 9/2010 |
| EP | 3654389 A1 | | 5/2020 |
| JP | 2005268719 A | * | 9/2005 |
| JP | 2014179374 A | | 9/2014 |
| KR | 20120028624 A | | 3/2012 |
| KR | 10-1149463 B | | 5/2012 |
| KR | 10-1666748 B | | 10/2016 |
| KR | 10-2018-0051019 A | | 5/2018 |
| WO | 2008030019 A1 | | 3/2008 |
| WO | 2016186317 A1 | | 11/2016 |
| WO | 2020101494 A1 | | 5/2020 |

OTHER PUBLICATIONS

PCT/US2020020481, "Extended European Search Report", mailed Nov. 25, 2022, 5 pages.

Huang et al., "Thermal properties of polyvinyl butyral/graphene composites ass encapsulation materials for solar cells", Solar Energy 161 (2018) 187-193. (Year: 2018).

Ephraim Trinidad, "Evaluation of Hybrid Electrically Conductive Adhesives" Received from https://uwspace.uwaterloo.ca/handle/10012/10991, University of Waterloo, 2016, 125 pages.

Boyd, Caleb C. et al., "Barrier Design to Prevent Metal-Induced Degradation and Improve Thermal Stability in Perovskite Solar Cells", ACS Energy Letters, 2018, pp. 1772-1778 (7 pgs. total).

Brinkmann, K.O. et al., "Suppressed decomposition of organometal halide perovskites by impermeable electron-extraction layers in inverted solar cells", nature communications, Article, Published Jan. 9, 2017, DOI:10.1038/ncomms13938, 9 pgs.

Bush, Kevin A. et al., "23.6%-efficient monolithic perovskite/silicon tandem solar cells with improved stability", nature energy, published Feb. 17, 2017, vol. 2, Article No. 17009, 7 pgs.

Bush, Kevin A. et al., "Thermal and Environmental Stability of Semi-Transparent Perovskite Solar Cells for Tandems Enabled by a Solution-Processed Nanoparticle Buffer Layer and Sputtered ITO Electrode", Advanced Materials, Materials Views, Communication, published 2016, DOI:10.1002/adma.201505279, pp. 3937-3943 (7 pgs. total).

Cheacharoen, Rongrong et al., "Design and understanding of encapsulated perovskite solar cells to withstand temperature cycling", Royal Society of Chemistry, Paper, Energy & Environmental Science, published Oct. 20, 2017, 7 pgs.

Chen, Han et al., "A solvent-and vacuum-free route to large-area perovskite films for efficient solar modules", Letter, doi:10.1038/nature23877, 2017, vol. 000, 15pgs.

Christians, Jeffrey A. et al., "Stability at Scale: Challenges of Module Interconnects for Perovskite Photovoltaics", ACS Energy Letters, Energy Express, published 2018, DOI:10.11021/acsenergylett.8b01498, pp. 2502-2503 (2 pgs. total).

Crozier, M.L. et al., "Recent developments toward a one step thin-film PV interconnection process using laser scribing and inkjet printing", ResearchGate, Conference Paper, published Jun. 2014, DOI: 10.1109/PVSC.2014.6925507, pp. 2784-2788 (6 pgs. total).

Domanski, Konrad et al., "Not All That Glitters Is Gold: Metal-Migration-Induced Degradation in Perovskite Solar Cells", ACS NANO, Article, published 2016, DOI:10.1021/acsnano.6b02613, pp. 6306-6314 (9 pgs. total).

Dongaonkar, S. et al. "Performance and Reliability Implications of Two-Dimensional Shading in Monolithic Thin-Film Photovoltaic Modules," IEEE Journal of Photovoltaics, vol. 3, No. 4, Oct. 2013, pp. 1367-1375, 9 pgs. total.

Eperon, Giles E. et al., "Perovskite-perovskite tandem photovoltaics with optimized bandgaps", ResearchGap, Article in Science, Oct. 2016, DOI:10.1126/science.aaf9717, 10 pgs.

Fields, J.D. et al., "Printed interconnects for photovoltaic modules", Elsevier, Solar Energy Materials & Solar Cells 159 (2017) pp. 536-545, (10 pgs. total).

Gehlhaar, Robert et al., (2015). "Perovskite solar modules with minimal area loss interconnections", SPIE Newsroom. 10.1117/2.1201509.006116., 3 pgs.

Grancini, G. et al., "One-Year stable perovskite solar cells by 2D/3D interface engineering", nature communications, Article, published Jun. 1, 2017, DOI:10.1038/ncomms15684, 8 pgs.

Heise, Gerhard et al., "Monolithical Serial Interconnects of Large CIS Solar Cells with Picosecond Laser Pulses", Elsevier, Physics Procedia, ScienceDirect, LiM 2011, pp. 149-155 (7 pgs. total).

Horowitz, Kelsey A.W. et al., "An analysis of glass-glass CIGS manufacturing costs", Elsevier, Solar Energy Materials & Solar Cells 154, 2016, 10 pgs.

Jacobs, Daniel A. et al., "A re-evaluation of transparent conductor requirements for thin-film solar cells", Royal Society of Chemistry, Paper, Journal of Materials Chemistry A, published Feb. 25, 2016, pp. 4490-4496 (7 pgs. total).

Jin et al., "High temperature coefficient of resistance molybdenum oxide and nickel oxide thin films for microbolometer applications", Optical Engineering 54(3), 037101-1-037101-6 (Mar. 2015).

Jones-Albertus, Rebecca et al., "Technology advances needed for photovoltaics to achive widespread grid price parity", Progress in Photovoltaics, piblished 2016, DOI:10.1002/pip.2755, pp. 1272-1283 (12 pgs. total).

Kaltenbrunner, Martin, "Flexible high power-per-weight perovskite solar cells with chromium oxide-metal contacts for improved stability in air", nature materials, published Aug. 24, 2015, DOI:10.1038/NMAT4388, pp. 1032-1041 (10 pgs. total).

Kato, Yuichi et al., "Silver Iodide Formation in Methyl Ammonium Lead Iodide Perovskite Solar Cells with Silver Top Electrodes", Advanced Materials Interfaces, Full Paper, published 2015, 6 pgs.

Leijtens, Thomas et al., "Opportunities and challenges for tandem solar cells using metal halide perovskite semiconductors," Nature Energy 3, 828-838 (2018) https://doi.org/10.1038/s41560-018-0190-4, 11 pages.

Li, Zhen et al., "Scalable fabrication of perovskite solar cells", Nature Reviews, Materials, vol. 3, Article No. 18017, published online Mar. 27, 2018, doi:10.1038/naturevmats.2018.17, 20 pgs.

Palma, Alessandro Lorenzo et al., "Laser-Patterning Engineering for Perovskite Solar Modules With 95% Aperture Ratio", IEEE Journal of Photovoltaics, published 2017, 7 pgs.

Pisoni, Stefano et al., "Impact of interlayer application on band bending for improved electron extraction for efficient flexible perovskite mini-modules", Elsevier, Nano Energy, published 2018, pp. 300-307 (8 pags. total).

Powalla, Dr.-Ing.Michael, "Development of Materials and Processes for the Production of Solar Modules, the Sequence of Processing Steps for the Production of a Cu(In,Ga)Se2 Thin-Film Solar Module", Zentrum fur Sonnenenergie- und Wasserstoff-Forschung (ZSW), Jun. 2008, Germany, 1 pg.

Rowell, Michael W., et al., "Transparent electrode requirements for thin film solar cell modules", Energy & Environmental Science,

(56) References Cited

OTHER PUBLICATIONS

Communication, Published on Nov. 5, 2010, the Royal Society of Chemistry, DOI:10.1039/c0ee00373e, 4 pgs.

Saha, B. et al. "Schottky diode behaviour with excellent photoresponse in NiO/FTO heterostructure", Applied Surface Science 418 (2017), Elsevier, pp. 328-334, 7 pgs. total.

Sanehira et al., "Influence of Electrode Interfaces on the Stability of Perovskite Solar Cells: Reduced Degradation Using MoOx/Al for Hole Collection", ACS Energy Lett. 2016, 1, 38-45. (Year: 2016).

Silverman, Timothy J., et al., "Thermal and Electrical Effects of Partial Shade in Monolithic Thin-Film Photovoltaic Modules" IEEE Journal of Photovoltaics, vol. 5, No. 6, Nov. 2015, 6 pages.

Silvestre, S., et al. "Study of Bypass Diodes Configuration on PV Modules" Applied Energy 86, (2009), Elsevier, pp. 1632-1640, 9 pgs. total.

Song, Zhaoning et al., "A technoeconomic analysis of perovskite solar module manufacturing with low-cost materials and techniques", Royal Society of Chemistry, Analysis, Energy & Environmental Science, published May 12, 2017, pp. 1297-1305 (13 pgs. total).

Steim, Roland et al. "Flexible polymer photovoltaic modules with incorporated organic bypass diodes to address module shading effects", Solar Energy Materials & Solar Cells 93 (2009), Elsevier, pp. 1963-1967, 5 pgs. total.

Unknown Author, "Module Shading Guide" First Solar, Inc., 2017, PD-5-367 Rev. 1.0, 8 pages.

Wilkinson, Ben et al. "Scaling limits to large area perovskite solar cell efficiency" EU PVSEC Paper, Wiley, Progress in Photovoltaics, Mar. 16, 2018, pp. 659-674, 16 pgs. total.

Yang, Mengjin et al., "Highly Efficient Perovskite Solar Modules by Scalable Fabrication and Interconnection Optimization", ACS Energy Letters, Letter, published 2018, pp. 322-328 (7 pgs. total).

You, Jingbi et al., "Improved air stability of perovskite solar cells via solution-processed metal oxide transport layers", nature nanotechnology, Articles, vol. 11, published online: Oct. 12, 2015, DOI:10.1038/NNANO.2015.230, pp. 75-82 (8 pgs. total).

Bermudez Veronica et al: "Understanding the cell-to-module efficiency gap in Cu(In,Ga) (S,Se)2 photovoltaics scale-up", Nature Energy, Nature Publishing Group UK, London, vol. 3, No. 6, Jun. 8, 2018 (Jun. 8, 2018), pp. 466-475.

\* cited by examiner

BYPASS DIODE INTERCONNECT FOR THIN FILM SOLAR MODULES

RELATED APPLICATIONS

This application claims the benefit of priority of U.S. Provisional Application No. 63/250,970 filed Sep. 30, 2021 which is incorporated herein by reference.

BACKGROUND

Field

Embodiments described herein relate to solar cells, and more particularly to interconnect structures with bypass diodes for perovskite solar cell modules.

Background Information

Photovoltaic cells, also referred to solar cells, are devices that convert radiant photo energy into electrical energy. Multiple solar cells may be integrated into a group to constitute a solar panel, or module, in which the solar cells are usually connected in series creating an additive voltage.

Reverse bypass diodes may be included in some implementations to provide operational stability to a photovoltaic module. For example, shading of a solar cell wired in series within a string of solar cells can force the cell into reverse bias, causing hot-spot heating which may lead to detrimental effects such as cracking, shorting, or delamination. A bypass diode can limit the reverse bias voltage a shaded solar cell experiences, thus preventing the creation of such hot-spots.

Bypass diodes may generally be soldered into a photovoltaic array during module layup and packaging. For a silicon solar cell array, only a few bypass diodes are required to ensure operational stability and prevent damage from hot-spots because of the high reverse bias breakdown voltage of silicon solar cells. Specifically, the bypass diodes are added at the edge of the photovoltaic module and connected in parallel to a string, or strings, of solar cells, with an opposite polarity to the solar cells. If one or more of the solar cells in a serially connected string is shaded, they could be put in reverse bias. In this case, the bypass diode that is wired in parallel to the string is put into forward bias to allow the flow of current over some threshold voltage, essentially allowing current to flow around the string including the shaded solar cell(s).

SUMMARY

Solar cell interconnect structures with bypass diodes and methods of manufacture are described. The bypass diodes in accordance with embodiments can be fabricated on the top sides of the solar cells (e.g. opposite transparent substrate) with a larger width/area compared to configurations where a bypass diode is integrated into the vertical interconnection between adjacent solar cells. The increased available area can decrease current density requirements of the integrated bypass diode proportionally. The bypass diode configurations in accordance with embodiments may also facilitate the use of common thin film deposition techniques for the fabrication of the bypass diodes such as printing techniques, sputtering, evaporation, and chemical vapor deposition, thus leveraging existing equipment used for the solar cell stack, optionally without subtractive patterning.

DETAILED DESCRIPTION

Figure 1:
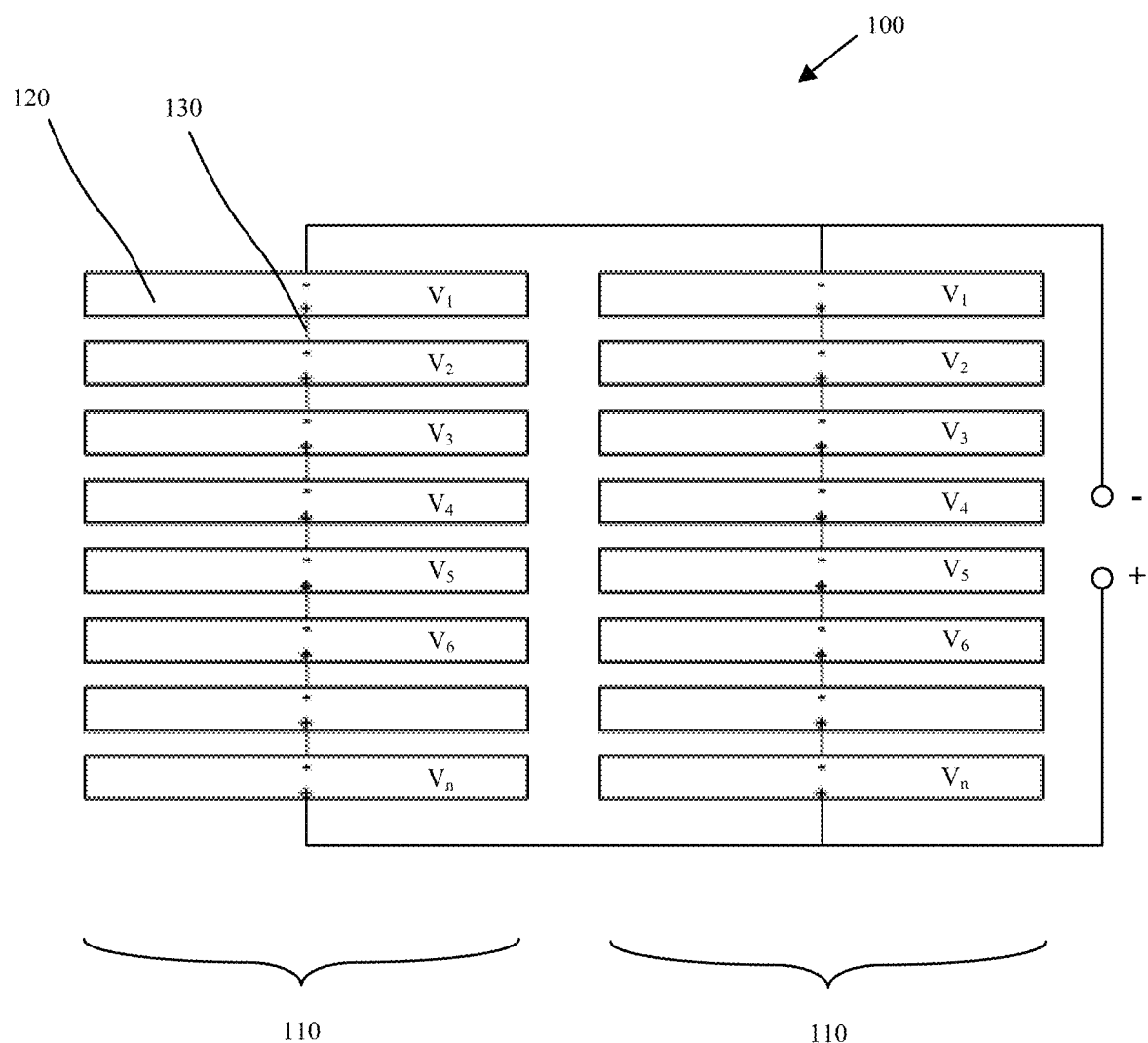
FIG. 1 is a schematic top view illustration and circuit diagram of a solar cell module in accordance with embodiments.

Embodiments describe solar cell interconnect structures with bypass diodes and methods of manufacture. In an embodiment, a solar cell interconnect with bypass diode includes a bottom electrode layer, a first patterned line opening in the bottom electrode layer, a subcell layer over the bottom electrode layer, a second patterned line opening in the subcell layer, a vertical interconnect within the second patterned line opening to optionally substantially fill the second patterned line opening, and a top electrode layer spanning over the subcell layer. A vertical interconnect is located within the second patterned line opening to provide electrical connection between the bottom electrode layer and the top electrode layer. The solar cell interconnect with bypass diode can further include a third patterned line opening in the top electrode layer, a semiconductor-based bypass layer over the top electrode layer and spanning over the vertical interconnect, and a bypass electrode layer over the semiconductor-based bypass layer and in contact with the top electrode layer. The semiconductor-based bypass layer may include one or more layers. In an embodiment, the semiconductor-based bypass layer includes p-type layer and an n-type layer to form a bypass diode with p-n junction. Alternatively, the semiconductor-based bypass layer may be a single dopant type to form a bypass diode with Schottky diode.

In one aspect, embodiments describe a bypass diode architecture between adjacent top electrodes of adjacent solar cells. This can alleviate space requirements compared to bypass diode architectures that insert the bypass diode within a patterned line opening between adjacent subcells. It has been observed that patterned line opening width between subcells for adjacent solar cells is generally minimized as much as possible for the sake of minimizing dead area. Thus, patterned line opening widths between subcells may be reduced to 50 μm or less, such as 10-50 μm. Where bypass diodes are inserted within the pattern line openings, the constrained area may require larger patterned line opening widths (e.g. greater than 100 μm) and/or the bypass diodes to carry high current density at relatively low voltage to protect the solar cells. Such a high turn current density may render Schottky diodes more suitable than p-n junctions for the bypass diodes, however leakage from Schottky diodes in such tight areas can lower device performance.

In accordance with embodiments, bypass diodes can be fabricated on the top sides of the solar cells (e.g. opposite from a supporting substrate) with a larger width/area, such as approximately 1-10 mm width, while retaining patterned line opening width between subcells at approximately 50 μm or less, such as 10-50 μm, or more specifically 20-40 μm. The increased available area (e.g. greater than 20×, or even greater than 50× or 100×) thus decreases current density requirements of the integrated bypass diode proportionally (e.g. greater than 20×, or even greater than 50× or 100×) thus making p-n junctions more capable of meeting performance specifications. Furthermore, p-n junctions may be capable of providing lower leakage current compared to Schottky diodes, thus preserving solar cell performance. In some embodiments, rectification ratios of greater than 50 at 1.25V can be achieved, with rectification ratio defined as current at +X volts/current at −X Volts. A typical silicon bypass diode may be characterized by a rectification ratio of approximately 100 at about 1 Volt.

In another aspect, the bypass diode embodiments may facilitate the use of common thin film deposition techniques for the fabrication of the bypass diodes such as printing techniques, sputtering, evaporation, and chemical vapor deposition, thus leveraging existing equipment used for the solar cell stack. Furthermore, larger feature sizes can allow for the use of shadow masks or printed layers without the requirement for subtractive patterning in some embodiments, such as laser scribing.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a schematic top view illustration is provided of a solar cell module in accordance with embodiments. As shown, the solar cell module 100 includes a plurality of cells 120 (also referred to as solar cells) coupled in series with interconnects 130, with the front of one cell connected to the rear of the next cell so that their voltages ($V_1 \ldots V_n$) add. The plurality of cells 120 may be arranged into one or more subsets 110 (e.g. strings) coupled in parallel, which may have the effect of decreasing total module voltage.

A thin-film solar cell 120 commonly includes a subcell layer between two electrodes, at least one of which being transparent. As described in more detail with regard to FIGS. 4A-4B and FIGS. 5A-5B, the subcell layer may commonly include an absorber layer and one or more transport layers (e.g. hole transport, electron transport). The subcell layers in accordance with embodiments can include a single junction, or a multiple junction structure with multiple absorber layers. In order to minimize loss due limited conductivity of the transparent electrode, the module is divided into the plurality of smaller cells 120 which are electrically connected in series. The serial interconnect methodologies in accordance with embodiments may generally include a plurality of patterned line openings (P1, P2, P3, etc.) to form interconnects 130, such as a first patterned line opening P1 through a bottom electrode, a second patterned line opening P2 through the subcell layer which includes the absorber and transport layer(s), and a third patterned line opening P3 through a top/rear electrode to electrically isolate adjacent cells 120.

Figure 2A:
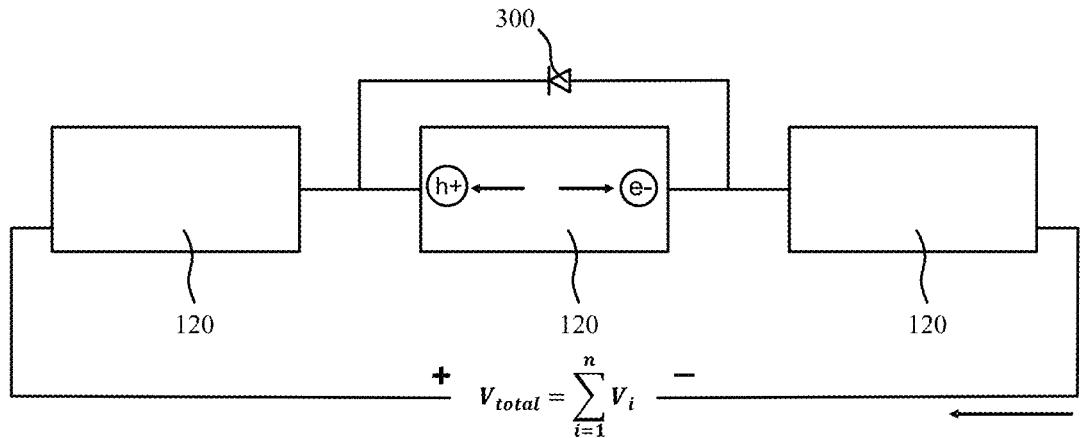
FIG. 2A is a circuit diagram illustrating a bypass diode in parallel with a solar cell in a string of solar cells in accordance with an embodiment.
Figure 2B:
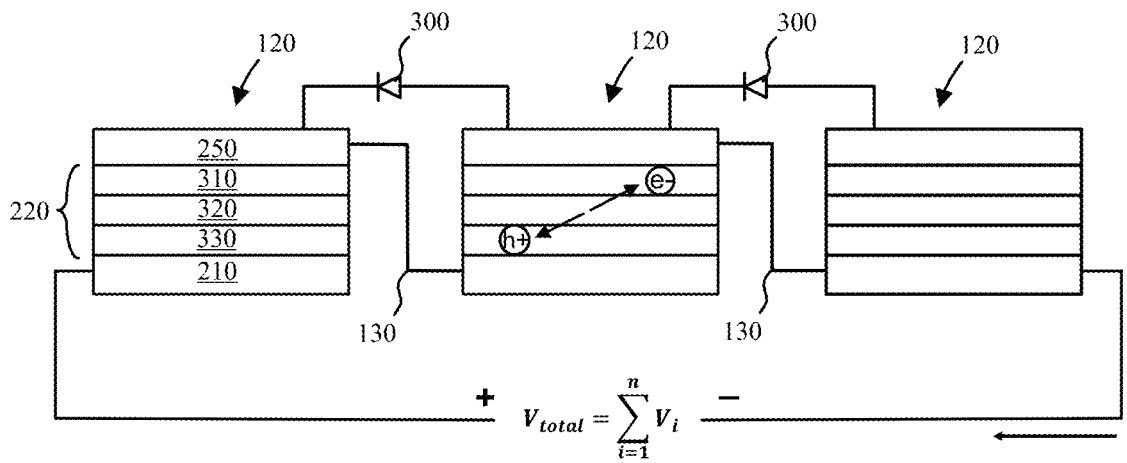
FIG. 2B is a combination solar cell stack-up and circuit diagram illustrating connections of bypass diodes between adjacent solar cells in a string of solar cells in accordance with an embodiment.

Referring now to FIGS. 2A-2B, FIG. 2A is a circuit diagram illustrating a bypass diode in parallel with a solar cell in a string of solar cells in accordance with an embodiment; FIG. 2B is a combination solar cell stack-up and circuit diagram illustrating connections of bypass diodes between adjacent solar cells in a string of solar cells in accordance with an embodiment.

As illustrated, the solar cell module circuit can include a plurality of solar cell 120 diodes connected in series between a pair of voltage terminals (+/−), and a plurality of bypass diodes 300. As shown in FIG. 2A, each bypass diode 300 is in parallel with a corresponding solar cell 120 diode. Referring to the detailed stack-up in FIG. 2B each solar cell 120 includes a bottom electrode layer 210 and top electrode layer 250, and subcell layer 220 between. As shown, each bypass diode 300 includes a first terminal connected to a top electrode layer 250 of a first adjacent solar cell 120 diode, and a second terminal connected to a top electrode layer 250 of a second adjacent solar cell 120 diode.

The particular embodiments illustrated in FIGS. 2A-2B illustrate solar cells 120 including a subcell layer 220 with bottom hole transport layer 330, absorber layer 320, and top electron transport layer 310. It is to be appreciated that this simplified stack-up is exemplary, and embodiments are not so limited. Embodiments may alternatively organize the transport layers in reverse, with a bottom electron transport layer 310 and top hole transport layer 330. Furthermore, the subcell layers 220 may include additional layers, and may include multiple cell stack-ups, such as tandem solar cell stack-ups.

Figure 3A:
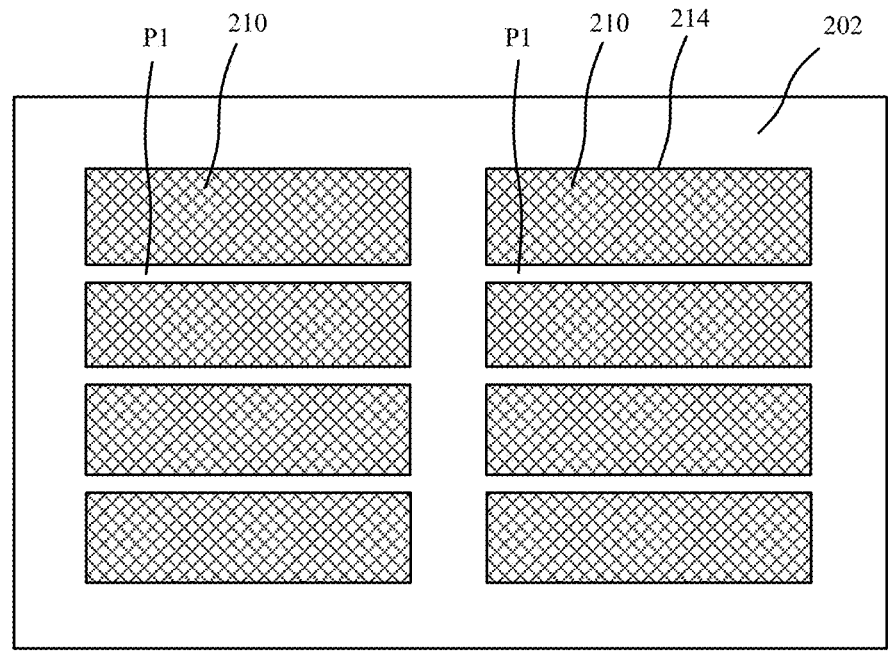
FIGS. 3A-3G are schematic top view illustrations of a method of fabricating a solar cell module in accordance with embodiments.
Figure 3B:
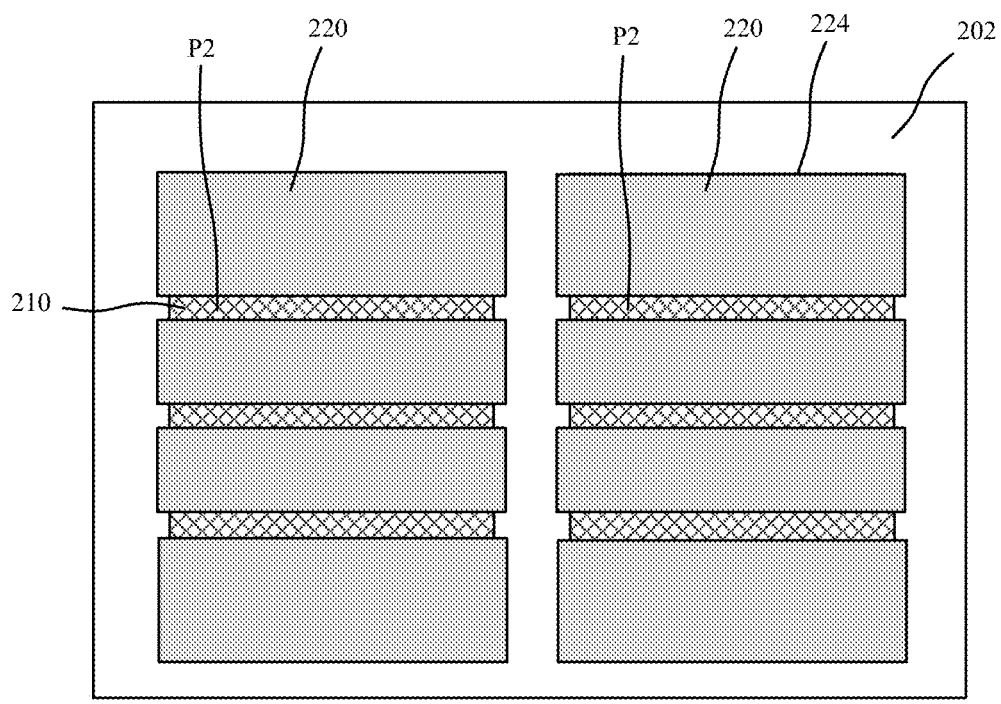

Referring now to FIGS. 3A-3E, schematic top view illustrations are provided of a method of fabricating a solar cell module 100 in accordance with embodiments. As shown in FIG. 3A, the sequence may begin with the formation of one or more bottom electrode layers 210 on a substrate 202. In an embodiment the substrate 202 is formed of a transparent material to function as a light receiving side for the solar cell module. In the particular embodiment illustrated the bottom electrode layer is patterned to form two subsets 110 that may be coupled in parallel as described with regard to FIG. 1. Each bottom electrode layer 210 includes an outside perimeter 214 and may be patterned to form first patterned line openings P1 and multiple adjacent bottom electrode layers 210. A subcell layer 220 may then be formed over the patterned bottom electrode layer 210, followed by patterning of second patterned line openings P2 as illustrated in FIG. 3B. As shown, the second patterned line opening P2 may expose the underlaying bottom electrode layer 210. The subcell layer 220 may optionally be longer than the bottom electrode layer 210 along the P1 scribe direction. In some embodiments, the outside perimeter 224 of the subcell layer 220 may be aligned with the outside perimeter 214 of the bottom electrode layer 210, or laterally surround the outside perimeter 214 of the bottom electrode layer. Alternatively, the subcell layer 220 may have the same width of the bottom electrode layer 210, which may provide encapsulation function for the subcell layer 220.

Figure 3C:
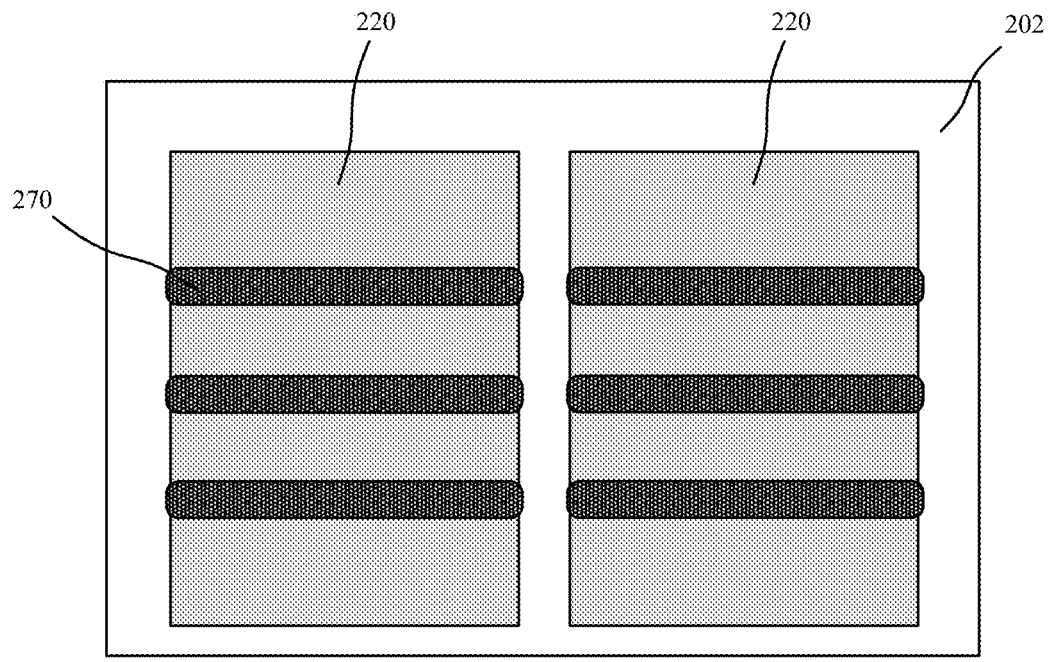

A vertical interconnect 270 may then be then formed within the second patterned line opening P2 and on the bottom electrode layer 210 as illustrated in FIG. 3C. In an embodiment, the vertical interconnect 270 includes a metallic material or carbon to provide vertical connection. In some embodiments, the vertical interconnect 270 is formed of a material that does not react with the absorber layer material. This may be useful if the vertical interconnect 270 is in contact with, or close proximity to a sensitive absorber layer material. For example, carbon and carbon/polymer blends are not reactive with perovskite-based materials. Carbon may also be characterized by a deep work function. Alternative structures, including trenches and intervening layers, may also be utilized to separate reactive or sensitive layers. Other suitable vertical interconnect 270 materials may include other metallic materials such as molybdenum, nickel, silver, gold, copper, and aluminum depending upon the solar cell materials, and interconnect structure. In an embodiment, the vertical interconnect may be formed of other conductive materials, such as metal oxide, or particles thereof. The vertical interconnect 270 may be formed using a suitable technique such as inkjet, extrusion, spraying, screen printing, etc.

Figure 3D:
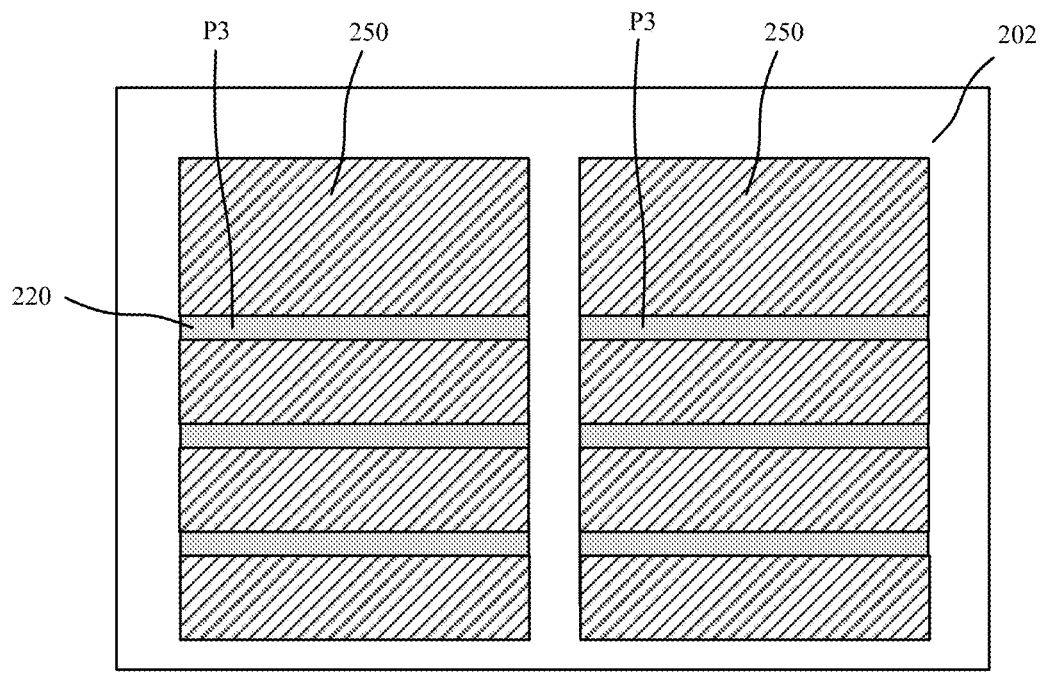

Referring now to FIG. 3D a patterned top electrode layer 250 is formed over the underlying structure, with the third patterned line openings P3 though the top electrode layer 250 separating top electrodes of adjacent cells 120. It is understood additional layer(s) may be formed prior to the top electrode layer 250, such as a conformal barrier layer, which will be described in more detail in the following description. The P3 scribe may extend through at least the top electrode layer 250, and may extend further through the conformal barrier layer when present and through the subcell layer 220 stopping on the bottom electrode layer 210. In an embodiment, the patterned top electrode layer 250 includes one or more metal layers, such as Ag, Cu, Al, Au, etc., and the bottom electrode layer 210 a transparent material. Exemplary transparent bottom electrode materials include poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc.

In accordance with some embodiments a separate vertical interconnect 270 is deposited in the second patterned line opening P2, followed by the formation of the top electrode layer 250. This is not required, and the vertical interconnect may also be integrally formed with the top electrode layer 250.

Figure 3E:
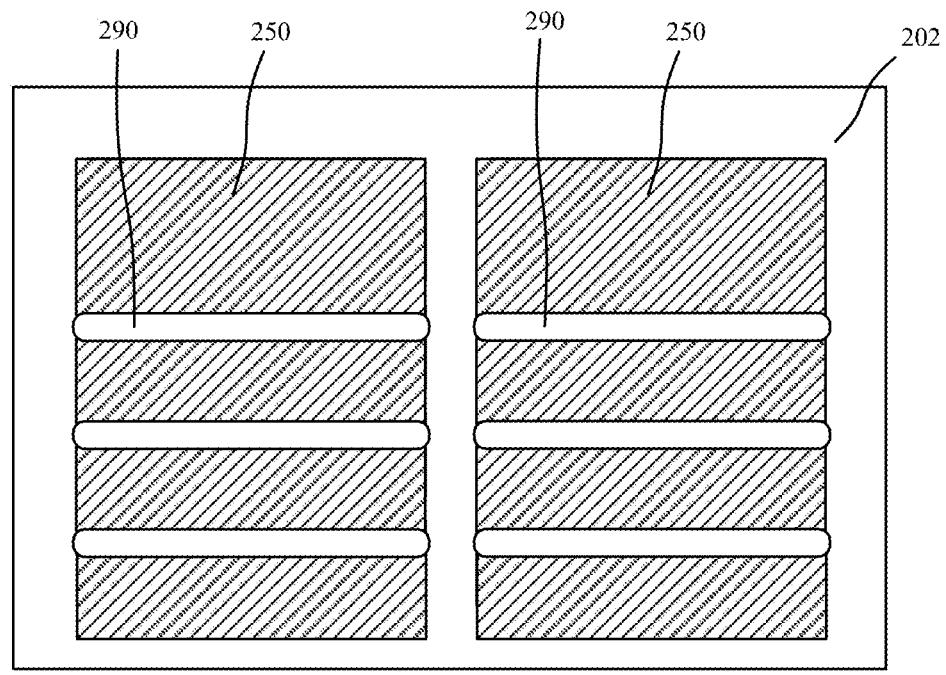

Referring now to FIG. 3E, an insulator material 290 can then optionally be applied to fill and passivate the third patterned line opening P3. For example, the insulator material 290 may be a polymer, metal oxide, or nitride material and may function to prevent metal degradation (e.g. from top electrode layer 250) from where the conformal transport layer 240 is interrupted by the third patterned line opening P3. In some embodiments an insulator material 290 is not applied.

Figure 3F:
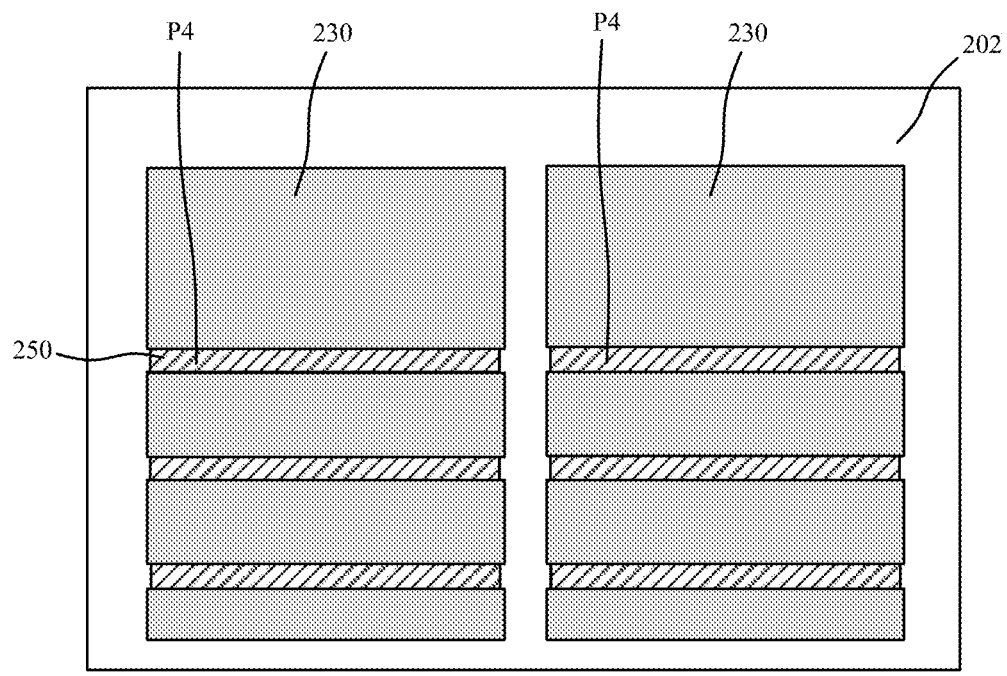

Referring now to FIG. 3F, a semiconductor-based bypass layer 230 can be formed over the underlying structure, including the optional insulator material 290 lines, and optionally patterned to form a fourth patterned line opening P4. The semiconductor-based bypass layer 230 can also be deposited within the third patterned line opening P3 where an insulator material 290 is not applied. The fourth patterned line opening P4 may extend through the semiconductor-based bypass layer 230, stopping on the underlying top electrode layer 250. The semiconductor-based bypass layer 230 may be formed using suitable technique(s) such as sputtering, evaporation, chemical vapor deposition followed by laser patterning to isolate individual bypass diodes. The semiconductor-based bypass layer 230 can also be patterned with a shadow mask where tolerance is large and feature size is on the order of millimeters rather than micrometers. This can allow the semiconductor-based bypass layer 230 to be deposited using similar equipment to the solar cell stack, leveraging existing equipment. Printing techniques such as inkjet, gravure, screen printing, extrusion, spraying, etc. can also be used, without requirement of separate scribing to the fourth patterned line opening P4.

The semiconductor-based bypass layer 230 in accordance with embodiments may include a single layer or multiple layers, which can be deposited using similar or different techniques. In an embodiment, the semiconductor-based bypass layer includes multiple layers and forms a p-n junction. For example, the semiconductor-based bypass layer can include a p-doped layer and an n-doped layer. Suitable materials for one or more layers forming the semiconductor-based bypass layer 230 include extrinsically doped, or intrinsically charged, metal oxides such as zinc oxide, aluminum doped zinc oxide (AZO), nickel oxide, tin oxide, indium oxide, titanium oxide, and niobium doped titanium oxide. Suitable organic materials for forming the semiconductor-based bypass layer include polymers such as poly(triaryl amine) (PTAA), poly(3,4-ethylenedioxythiophene) polystyrene sulfonate (PEDOT:PSS), and polyaniline, and small molecules such as 2,2',7,7'-Tetrakis[N,N-di (4-methoxyphenyl)amino]-9,9'-spirobifluorene (spiro-MeOTAD), spiroTTB (2,2',7,7'-Tetra(N,N-di-p-tolyl) amino-9,9-spirobifluorene), TBDi (5,10,15-Tribenzyl-10, 15-dihydro-5H-diindolo[3,2-a:3',2'-c]carbazole), and fullerenes. The semiconductor-based bypass layer may additionally be non-reactive with the absorber layer material.

Figure 3G:
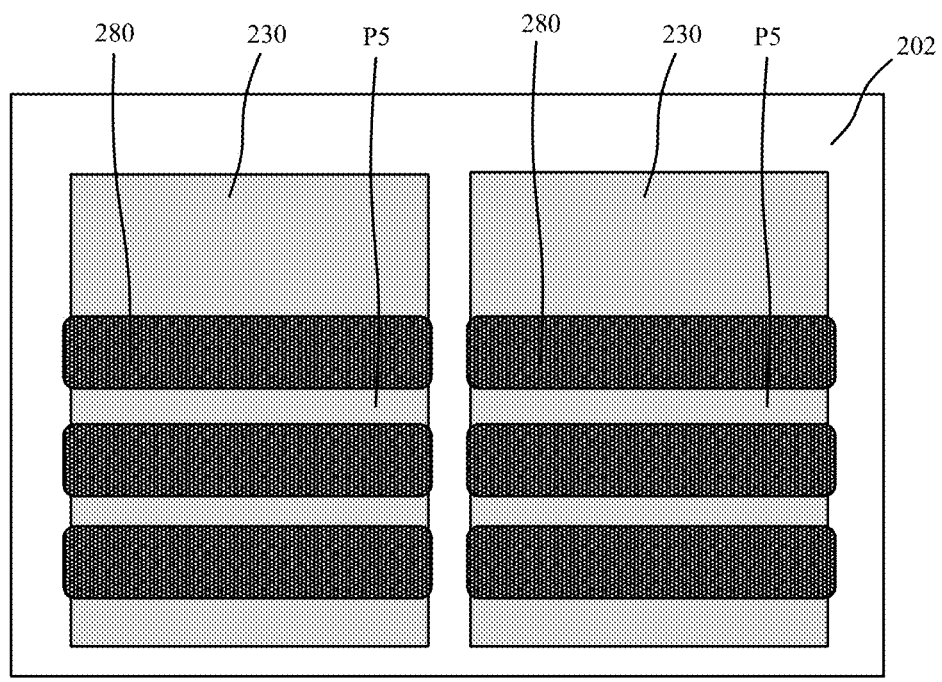

Bypass electrode layers 280 are then deposited over the semiconductor-based bypass layer 230 and within the fourth patterned line opening P4 as shown in FIG. 3G. The bypass electrode layers 280 can be formed using similar techniques such as the semiconductor-based bypass layer 230, and may optionally be patterned to form fifth patterned line openings P5. Similar to the fourth patterned line opening P4, the fifth patterned line openings P5 can be formed using patterning such as laser patterned, or shadow mask. Printing techniques can also be used without the requirement of separate scribing.

Figure 4A:
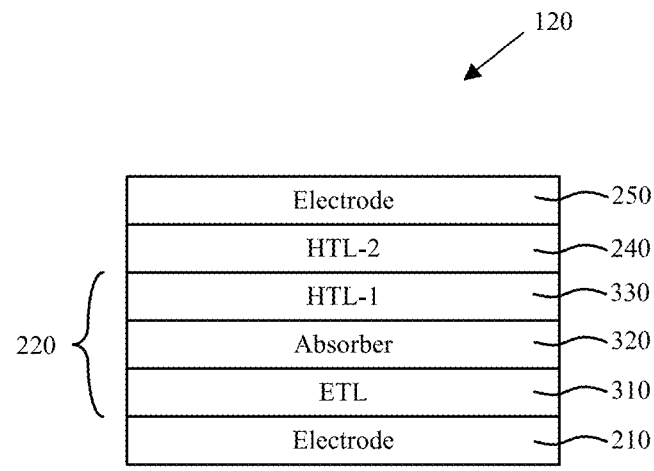
FIG. 4A is an illustrative diagram of solar cell stack-up in accordance with embodiments.
Figure 4B:
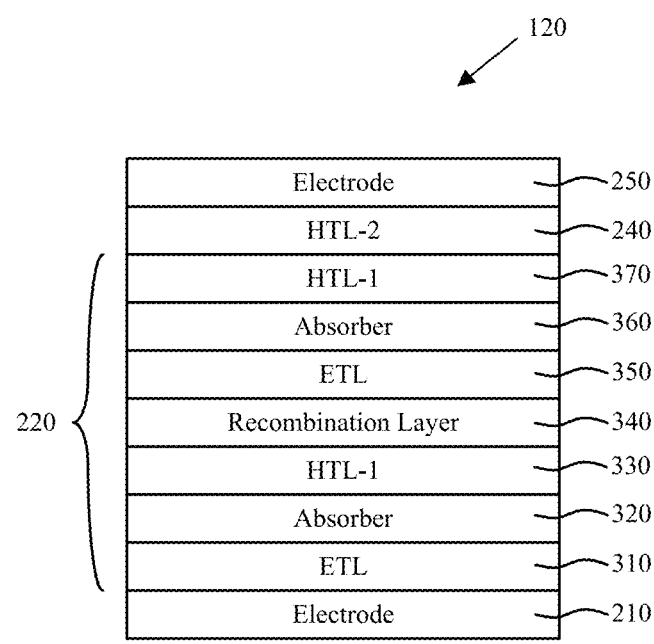
FIG. 4B is an illustrative diagram of tandem solar cell stack-up in accordance with embodiments.

Various exemplary solar cell 120 stack-ups are illustrated in FIGS. 4A-4B. FIG. 4A is an illustrative diagram of single junction solar cell stack-up in accordance with an embodiment. As illustrated, the solar cell 120 may include a bottom electrode layer 210, a top electrode layer 250, and a subcell layer 220 between the bottom and top electrode layers. Additionally, a conformal barrier layer 240 may be formed on the subcell layer 220. The conformal barrier layer 240 may additionally function as a charge transport layer. In the particular embodiment illustrated, the conformal barrier layer 240 functions as both a barrier layer and hole transport layer. The subcell layer 220 includes an absorber layer 320 and one or more transport layers. In the embodiment illustrated, the subcell layer 220 includes an electron transport layer (ETL) 310 over the bottom electrode, an absorber layer 320 over the ETL 310, and an optional first hole transport layer (HTL) 330 over the absorber layer 320. The conformal barrier layer 240 may also function as an HTL in this configuration, and physically separate the top electrode layer 250 from the subcell layer 220, and specifically from the absorber layer 320. In a specific embodiment, bottom electrode layer 210 is formed of a transparent material such as ITO or IZO, ETL 310 is formed of a n-type metal oxide such as titanium oxide, and the absorber layer 320 is a perovskite-based material. In an embodiment, optional HTL 330 is formed of PTAA or spiro-MeOTAD, while the conformal barrier layer 240 is formed of a metal oxide such as vanadium oxide or tungsten oxide. In an embodiment, the top electrode layer 250 includes one or more metal layers, such as Ag, Au, Cu, Al, etc.

FIG. 4B is an illustrative diagram of tandem solar cell stack-up in accordance with embodiments. The tandem structure may include multiple absorber layers, which may be the same or different materials. In the specific embodiment described the tandem structure is a perovskite-perovskite tandem structure, though embodiments are not so limited. Electrode layer 210, ETL 310, and absorber layer 320, and HTL 330 may be similar as described with regard to FIG. 4A. Similarly, ETL 350 may be similar to ETL 310, absorber layer 360 similar to absorber layers 320, and HTL 370 similar to HTL 330. Notably, while absorber layers 320, 360 may be formed of similar perovskite-based materials, they may be tuned for different bandgaps. A recombination layer 340 may be located between the stacked subcells, between ETL 350 and HTL 330. Recombination layer 340 may be a transparent conducting layer such as a TCO, or ITO specifically. Conformal barrier layer 240 and top electrode layer 250 may additionally be formed similarly as with regard to FIG. 4A.

Figure 5A:
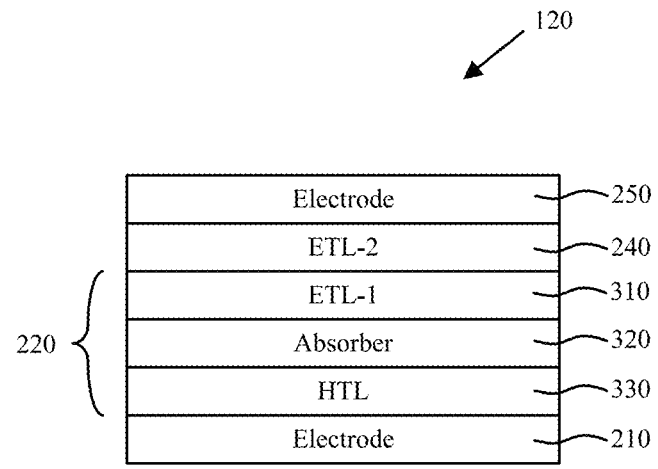
FIG. 5A is an illustrative diagram of solar cell stack-up in accordance with embodiments.
Figure 5B:
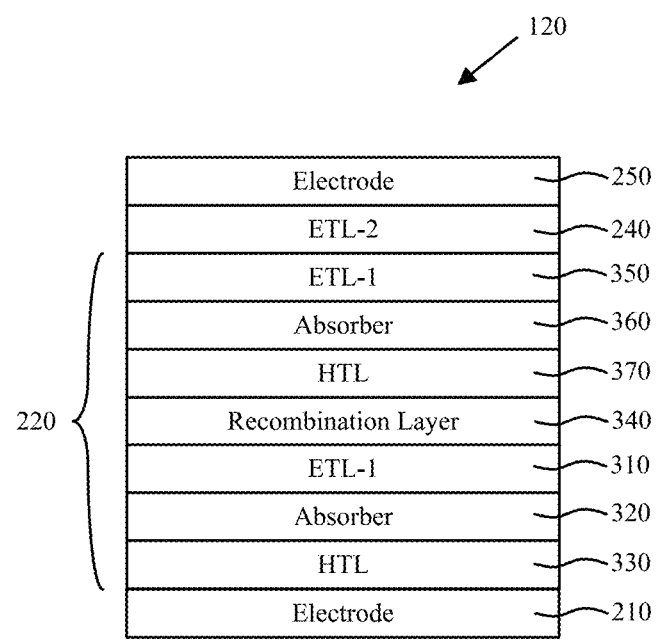
FIG. 5B is an illustrative diagram of tandem solar cell stack-up in accordance with embodiments.

Referring now to FIGS. 5A-5B, FIG. 5A is an illustrative diagram of solar cell stack-up in accordance with an embodiment, and FIG. 5B is an illustrative diagram of tandem solar cell stack-up in accordance with an embodiment. FIGS. 5A-5B are similar to the structures of FIGS. 4A-4B, with the order of electron and hole transport layers being flipped. This change in order of layer formation may additionally change materials selection of layers. In an embodiment, HTL 320 is formed of a metal oxide such as nickel oxide. ETL 310 may be a single layer or multiple layers. In an embodiment of FIG. 5A, ETL 310 is formed of a fullerene, with the conformal barrier layer 240 including a transparent metal oxide such as tin oxide, AZO, or titanium dioxide. In an embodiment of FIG. 5B, ETL 310 may include multiple layers, for example a transparent metal oxide such as tin oxide or AZO formed over a fullerene layer. Other layers illustrated may be similar as described with regard to FIGS. 4A-4B.

Figure 6A:
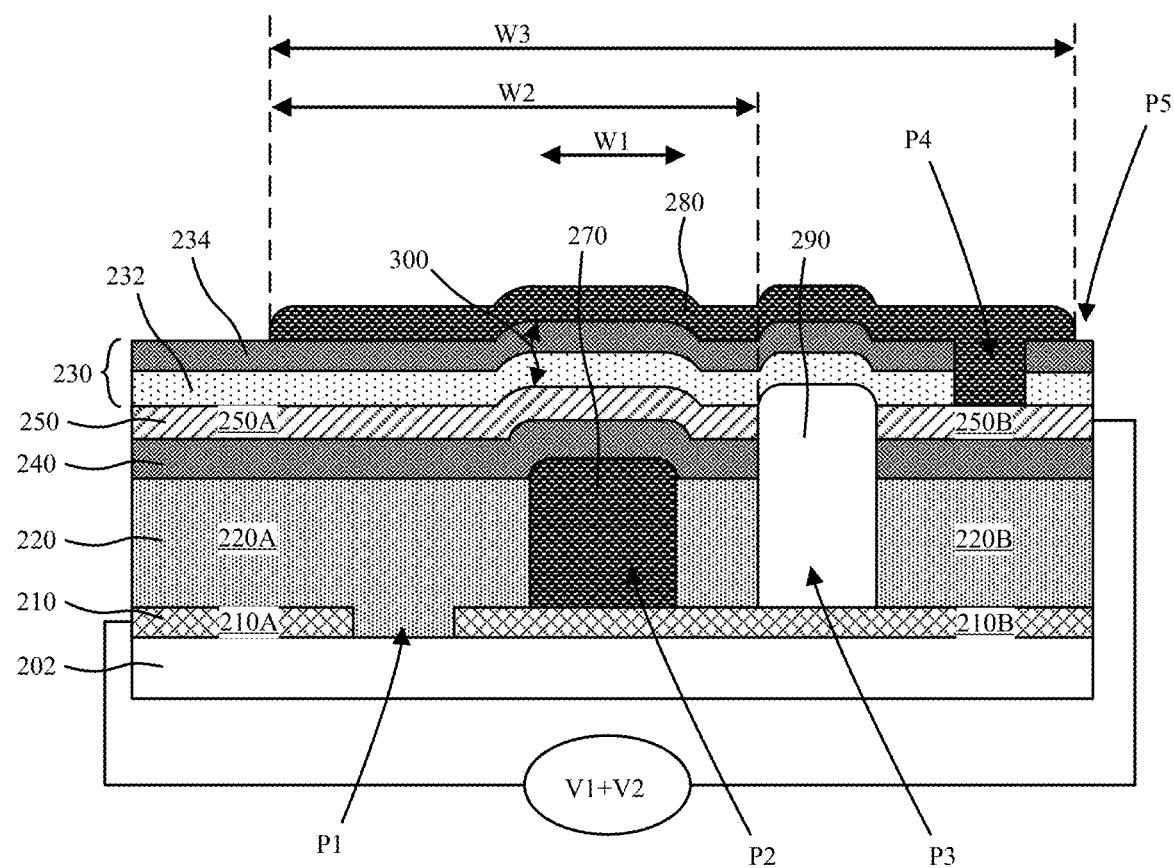
FIGS. 6A-6C are schematic cross-sectional side view illustrations of solar cell interconnects with bypass diodes in accordance with embodiments.
Figure 6B:
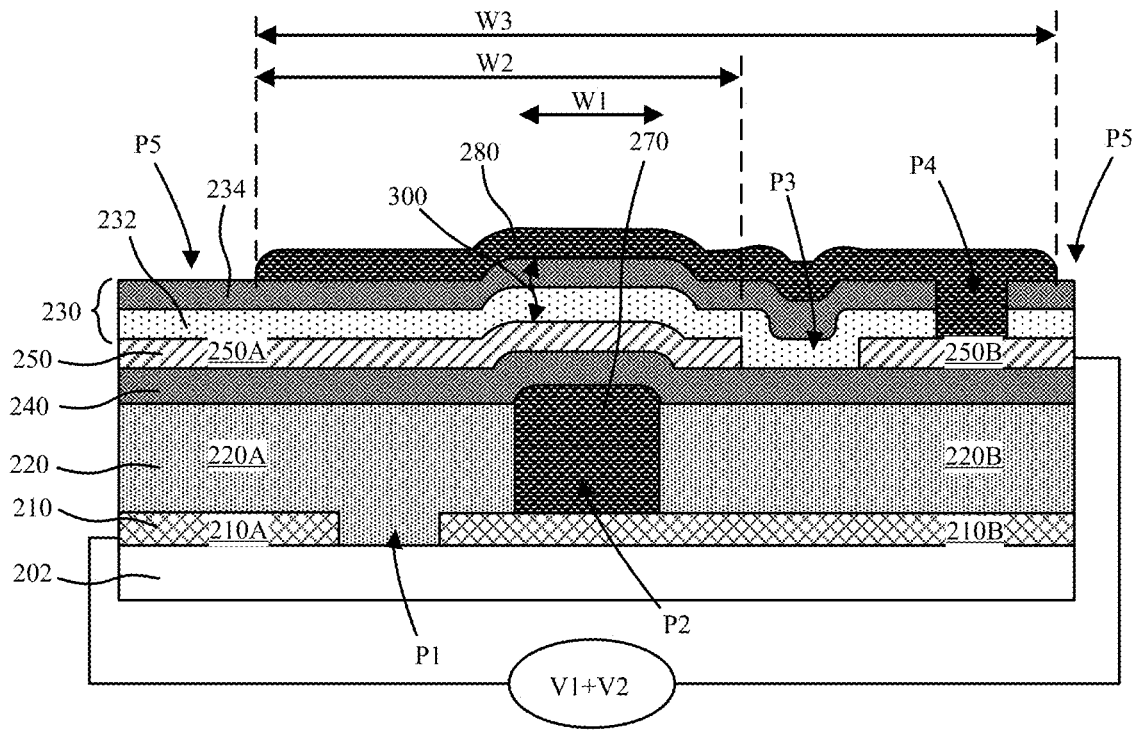
Figure 6C:
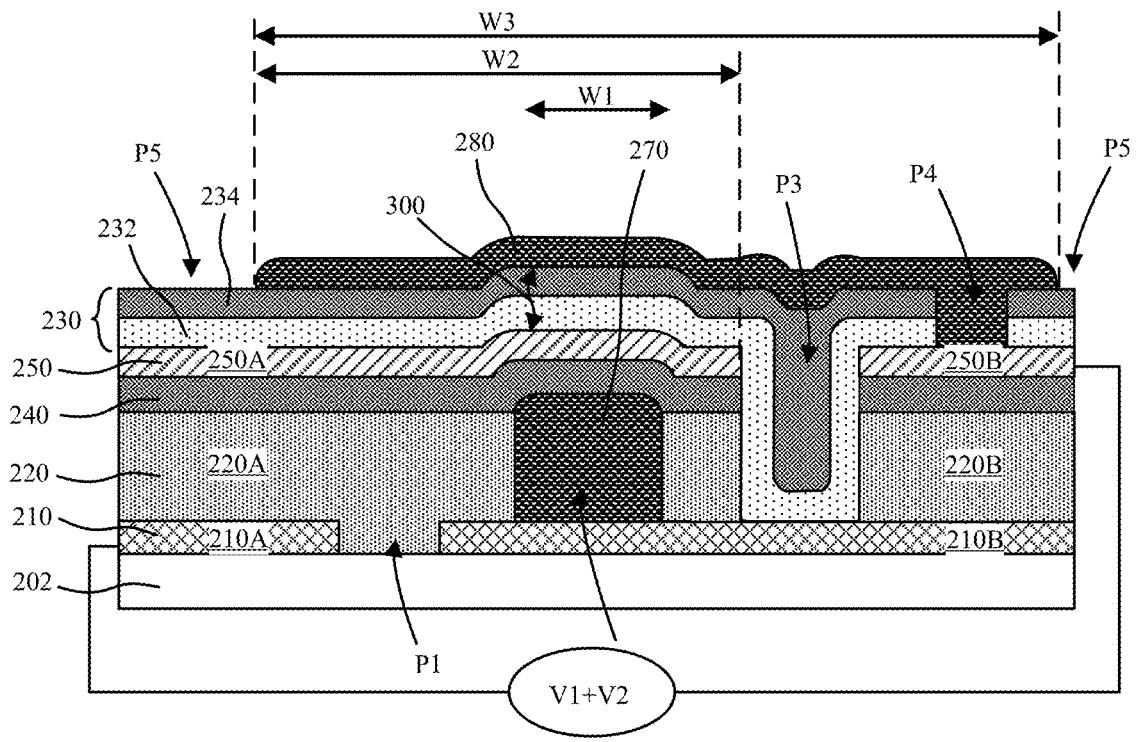
Figure 7:
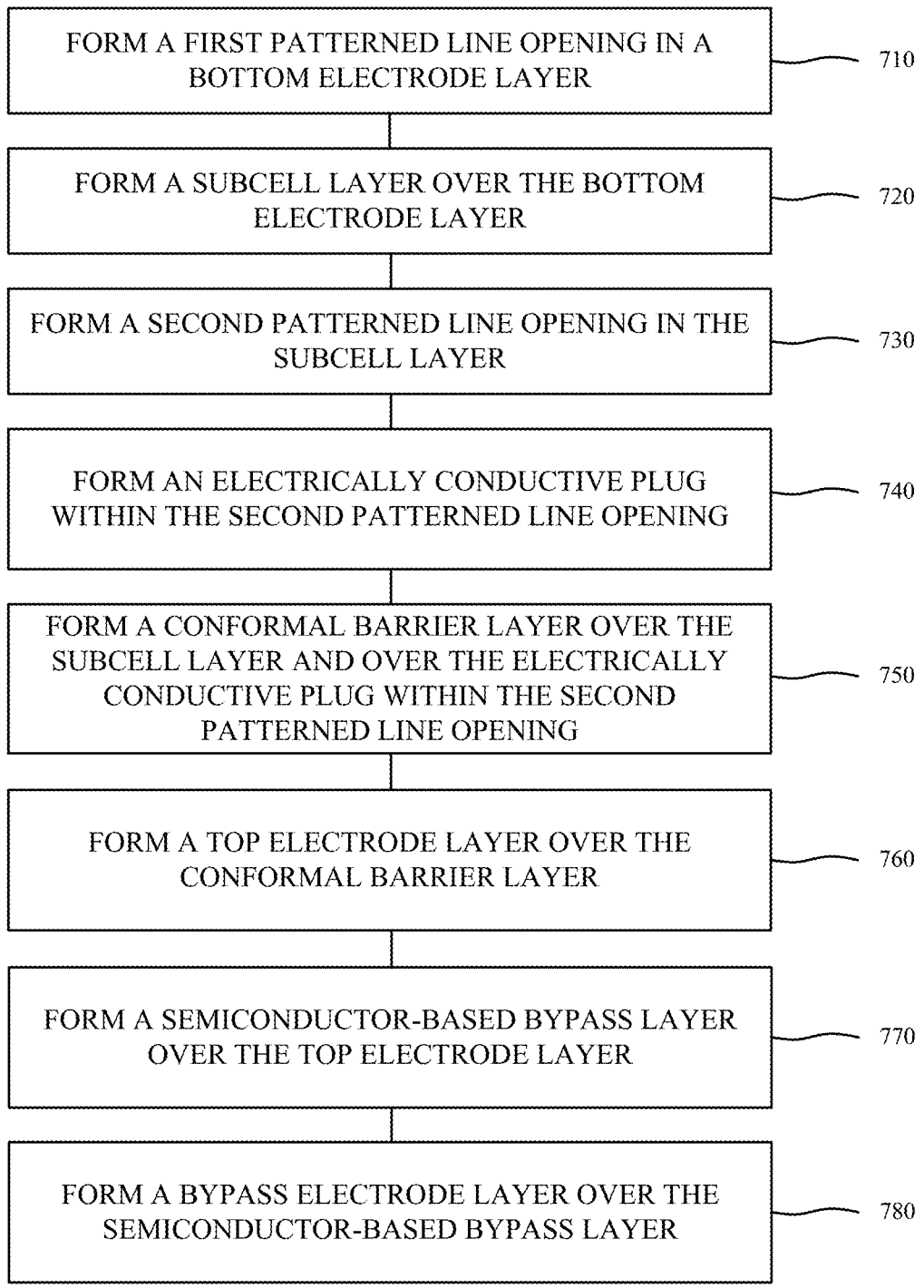
FIG. 7 is flow chart illustrating a method of forming the solar cell interconnects with bypass diodes of FIGS. 6A-6C in accordance with an embodiment.

Referring now to FIGS. 6A-8J, FIGS. 6A-6C are schematic cross-sectional side view illustrations of solar cell interconnects with bypass diodes in accordance with embodiments; FIG. 7 is flow chart illustrating a method of forming the solar cell interconnects with bypass diodes of FIGS. 6A-6C in accordance with an embodiment. FIGS. 8A-8J are schematic cross-sectional side view illustrations of a method of forming the solar cell interconnect with bypass diode of exemplary FIG. 6A in accordance with an embodiment. In interest of clarity and conciseness the solar cell interconnects with bypass diodes of FIGS. 6A-6C, processing sequence of FIG. 7 and the cross-sectional side view illustrations of FIGS. 8A-8J are described concurrently and with regard to each other. It is understood that certain embodiments may be practiced without one or more of these specific details, or in combination with other known methods and configurations described herein.

Referring now to FIGS. 6A-6C schematic cross-sectional side view illustrations are provided of solar cell interconnects with bypass diodes in accordance with embodiments. Specifically, FIGS. 6A-6C illustrate the interconnect between serial cells 120, and additive voltages V1, V2 as shown in FIG. 1. In FIG. 6A and FIG. 6C a third patterned line opening P3 is illustrated as being formed through the top electrode layer, optional barrier layer 240 and subcell layer 220 to expose the bottom electrode layer 210. Furthermore, an insulator material 290 is applied to the third patterned line opening P3 in FIG. 6A. It is not required to include an insulator material 290, or for the third patterned line opening P3 to extend past the top electrode layer 250. For example, as shown in FIG. 6B, the third patterned line opening P3 is formed only in the top electrode layer 250. Depth of the third patterned line opening P3 may depend upon method of creation, and may stop at any depth above the bottom electrode layer 210. In the embodiments illustrated in FIGS. 6B-6C the semiconductor-based bypass layer 230 can partially or completely fill the third patterned line opening P3.

Figure 8A:
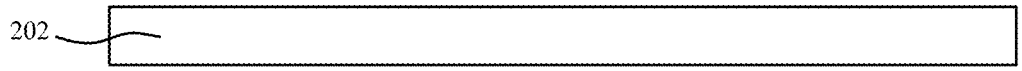
FIGS. 8A-8J are schematic cross-sectional side view illustrations of a method of forming the solar cell interconnect with bypass diode of FIG. 6A in accordance with an embodiment.
Figure 8B:
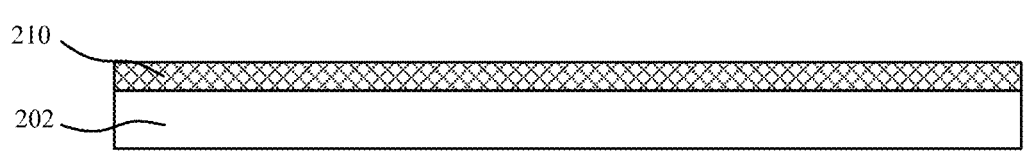
Figure 8C:
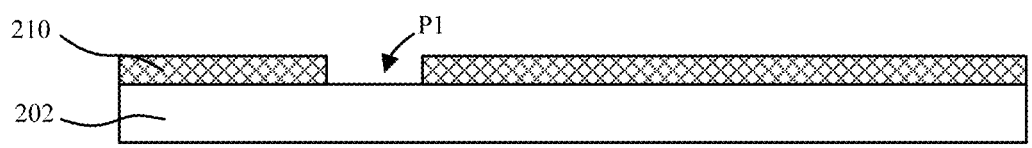

As shown in FIG. 8A the processing sequence may begin with a substrate 202. Substrate 202 may be a single or multiple layer substrate, including one or more layers of glass, plastic, or conductive metal foil. In an embodiment, the substrate 202 is formed of a transparent material. The bottom electrode layer 210 may then be formed on substrate 202 as illustrated in FIG. 8B. Bottom electrode layer 210 may be formed of materials such as cadmium stannate, TCOs, including ITO, FTO, IZO, etc. Referring now to FIG. 8C, at operation 710 a first patterned line opening P1 is then formed in the bottom electrode layer 210. Various patterning techniques such as mechanical or laser scribing, chemical etching, or deposition with a shadow mask can be used to form P1. In an embodiment, mechanical or laser scribing is utilized in a roll-to-roll manufacturing process.

Figure 8D:
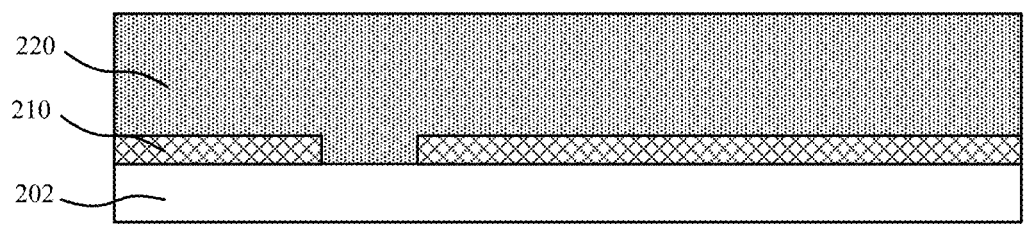

The subcell layer 220 is then formed over the patterned bottom electrode layer 210 at operation 720, as shown in FIG. 8D. The subcell layer 220 generally includes a subcell including an absorber layer and one or more transport layers. In an embodiment, the subcell layer includes an absorber layer between a hole transport layer and an electron transport layer. The subcell layer 220 may include a single subcell, or multiple subcells such as with a tandem structure. In accordance with embodiments, the subcell layer 220 includes one or more absorber layers including a perovskite material. In an embodiment, the subcell layer 220 includes a tandem structure including a perovskite material in one or both of the subcells. For example, a tandem perovskite cell structure may include two subcells with perovskite absorber layers with different bandgaps. Perovskite materials may be characterized by the formula $ABX_3$, with A representing a large atomic or molecular cation (e.g. Cs, methylammonium, formamidinium, etc.), with B representing a positively charged cation (e.g. metal, lead, plumbate, Sn), and X representing a negatively charged anion (e.g. halide, I, Br, Cl).

In the particular embodiment illustrated, the subcell layer 220 may include a perovskite absorber layer. However, the general arrangement is not limited to perovskite materials. In an embodiment, the subcell layer 220 includes an absorber layer formed of a material such as CdTe, copper indium gallium selenide (CIGS), or an organic semiconductor. In an embodiment, the subcell layer 220 includes a tandem structure including multiple subcells.

Figure 8E:
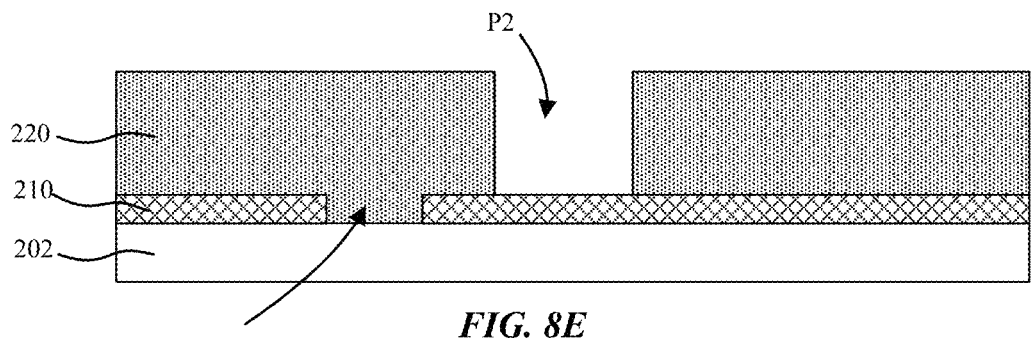
Figure 8F:
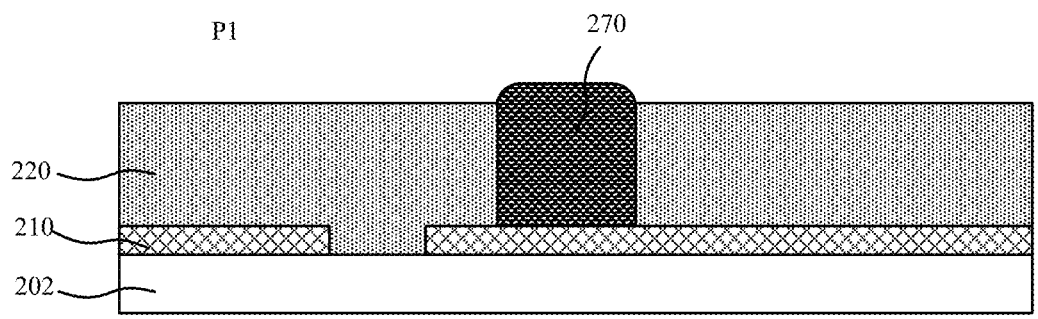

Referring to FIG. 8E the subcell layer 220 is then patterned to form a second patterned line opening P2 at operation 730. While the first and second patterned line openings are illustrated as not overlapping, this is not strictly required and they may also overlap. Referring to FIG. 8F, at operation 740 an (electrically) vertical interconnect 270 is formed within P2 and on the bottom electrode layer 210. The vertical interconnect 270 may be formed of a variety of materials and may be formed separately from the top electrode layer 250, or integrally formed as part of the top electrode layer 250.

In an embodiment, the vertical interconnect 270 is formed of a material(s) that do not react with the absorber layer(s), such as carbon or a carbon/polymer blend, printed ITO nanoparticles or other TCO nanoparticles. The vertical interconnect 270 may be formed using a suitable printing technique such as inkjet, extrusion, spraying, etc. so that further patterning is not necessary. A conductivity of the vertical interconnect 270 in accordance with embodiments may only be greater than about 0.001 S/cm due to the short distance of the interconnection based on the thin film thickness in the 0.1-5 µm range. Such a low conductivity can be achieved by a range of materials that do not react with the perovskite such as carbon (bulk conductivity around 1-100 S/cm) and ITO nanoparticles. In an embodiment, the vertical interconnect 270 includes particles dispersed in a matrix (e.g. polymer matrix). The carbon and/or TCO particles can be mixed into a polymer blend in order to make it easier to suspend the carbon or TCO nanoparticles in a solvent and deposit the interconnects through a printing technique like inkjet or spraying. Due to the low conductivity required, a very high conductive particle to polymer ratio is not required. Such a polymer could be a binder like poly (vinylidene fluoride) (PVDF), polyvinyl fluoride, polyvinylchloride, polystyrene, PMMA, PVA, polyvinyl phenol, polyethylene glycol, etc. The carbon may be graphite or carbon black in an embodiment, but could include graphene or carbon nanotubes or amorphous carbon. The TCO particles may be ITO or IZO nanoparticles with diameters between 10-200 nm in an embodiment, but could be AZO, $Sb:SnO_2$, zinc tin oxide, cadmium stannate and could be microparticles with diameters between 0.2-2 µm.

In an embodiment, the vertical interconnect 270 is formed of a metal material. In an embodiment, the vertical interconnect 270 is formed as part of the top electrode layer 250 as described in more detail with regard to FIGS. 9-10.

Figure 8G:
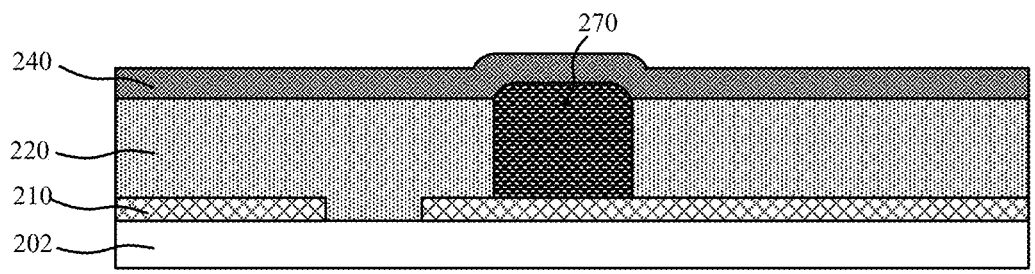

Referring now to FIG. 8G, at operation 750 a conformal barrier layer 240 is formed over the subcell layer 220 and over the electrically vertical interconnect 270 within P2. In particular, a conformal barrier layer 240 may be present when the top electrode layer 250 includes a metal layer, the bottom electrode layer 210 includes a transparent material, and the absorber layer is sensitive to metal contamination. The conformal barrier layer 240 may function to encapsulate and protect the subcell layer 220, for example from decomposition and metal diffusion. Suitable deposition techniques to form a conformal layer may include chemical vapor deposition (CVD), atomic layer deposition (ALD), solution coating and evaporation. In an embodiment, the conformal transport layer is less than 150 nm thick, or more specifically less than 50 nm thick such as 10-20 nm thick. The conformal barrier layer may be doped. For example, the conformal barrier layer may be AZO. The conformal barrier layer may be sufficiently thin to transport charge through its thickness, and not be laterally conductive so as to not short adjacent cells 120. The conformal barrier layer 240 may be characterized by a resistivity greater than 0.1 ohm·cm. In an embodiment, the conformal barrier layer also functions as an electron transport layer to the subcell layer 220.

Figure 9:
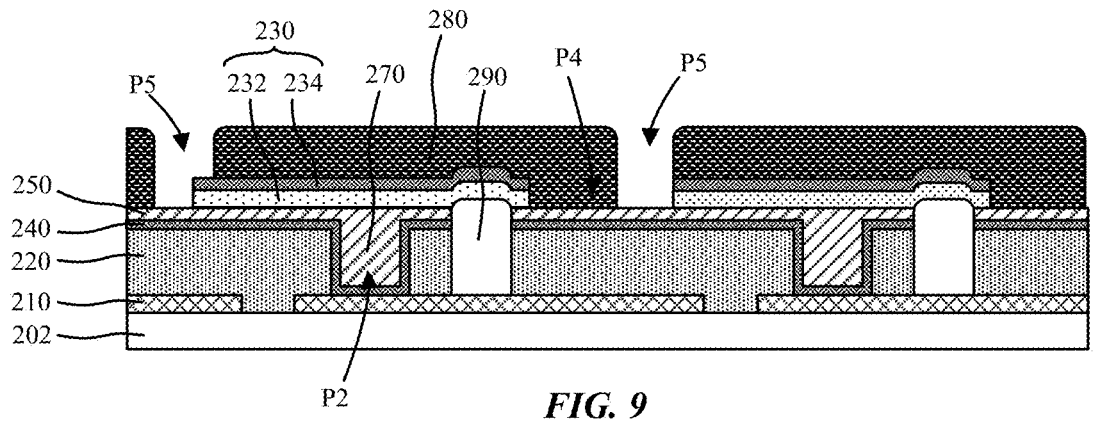
FIG. 9 is a schematic cross-sectional side view illustration of a solar cell interconnect with bypass diode with a metal vertical interconnect and without a fourth patterned line opening P4 scribe in accordance with an embodiment.
Figure 10:
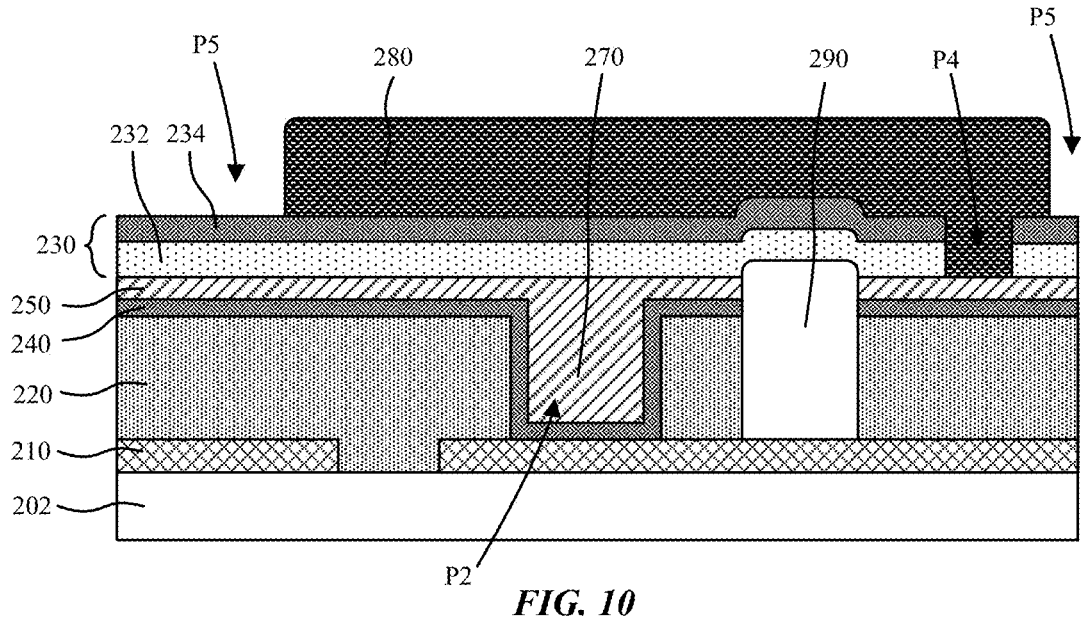
FIG. 10 is a schematic cross-sectional side view illustration of a solar cell interconnect with bypass diode with a metal vertical interconnect and a fourth patterned line opening P4 scribe in accordance with an embodiment.

Referring again briefly to the variations in FIGS. 9-10, the conformal barrier layer 240 may line the sidewalls, and optionally bottom surface, of the second patterned line opening P2. In such a configuration, the conformal barrier layer 240 may still function to encapsulate and protect the subcell layer 220, for example from decomposition and metal diffusion.

It has been observed that perovskite materials are prone to decomposition at elevated temperatures, and in particular the A-site cation of $ABX_3$ metal-halide perovskites. Additionally, perovskite materials are highly susceptible to metal induced degradation caused by halide-metal interactions. In accordance with embodiments, a conformal barrier layer 240 may be used to protect against either of decomposition and metal induced degradation due to diffusion from a metal electrode. In accordance with embodiments, the conformal barrier layer 240 may encapsulate a subcell layer 220 that includes a perovskite material absorber layer. In an embodiment, the conformal barrier layer 240 laterally surrounds the outside perimeter 224 of the subcell layer 220, or at least the perovskite material absorber layer of the subcell layer 220.

Figure 8H:
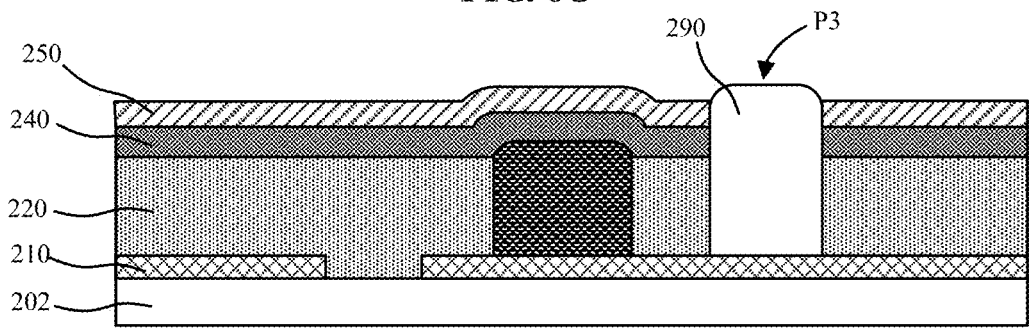

The top electrode layer 250 may then be formed over the optional conformal barrier layer 240 at operation 760 as illustrated in FIG. 8H. In an embodiment, the top electrode layer 250 includes one or more metal layers, such as Ag, Cu, Al, Au, etc. In the process variations illustrated in FIGS. 9-10 formation of the top electrode layer 250 can also include formation of the vertical interconnect 270. In an embodiment illustrated in FIG. 8H, scribing can be performed to create P3 similarly as described and illustrated with regard to FIG. 6A, followed by at least partially filling with an insulator material 290. Alternatively, the top electrode layer 250 is deposited through a shadow mask to form the third patterned line opening P3 during deposition. This may protect underlying layers from a solution processing operation. Suitable deposition technique may include evaporation, sputter, printing, and spraying. In this manner, the third patterned line opening P3 would not extend through the optional conformal barrier layer 240 and underlying subcell layer 220.

In the illustrated embodiment, the insulator material 290 can substantially fill the third patterned line opening P3. The insulator material 290 may additionally protect the subcell layer 220 against decomposition and metal induced degradation due to diffusion from a metal electrode. Together the substrate 202, conformal barrier layer 240 and insulator material 290 can form a seal surrounding the subcell layer 220. In the embodiments illustrated in FIGS. 6B-6C, the insulator material 290 is not formed within the third patterned line opening P3, and instead the semiconductor-based bypass layer 230 can partially or completely fill the third patterned line opening P3. In this manner, the substrate 202, conformal barrier layer 240 and semiconductor-based bypass layer 230 can form a seal surrounding the subcell layer 220.

Figure 8I:
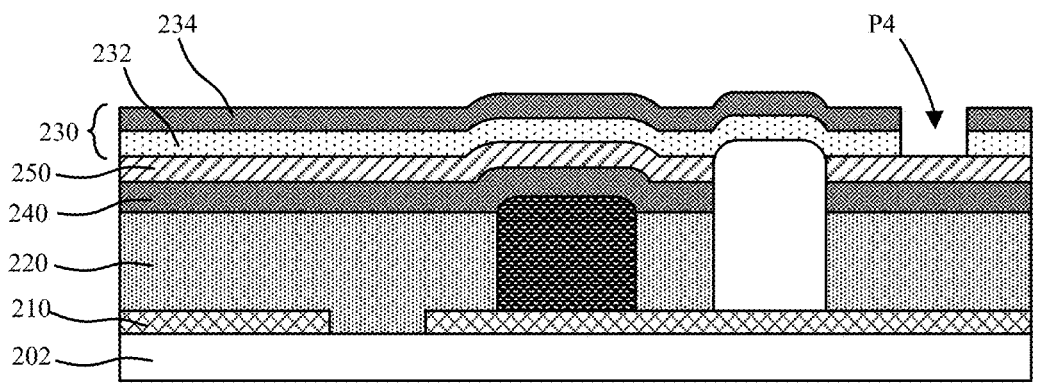

A semiconductor-based bypass layer 230 can be formed over the patterned top electrode layer 250 as well as the optional insulator material 290 at operation 770, and as illustrated in FIG. 8I. In the particular embodiment illustrated, the semiconductor-based bypass layer 230 includes an n-type layer 232 and a p-type layer 234, though dopants can be reversed. In an exemplary implementation, the n-type layer 232 is formed of a metal oxide such as $SnO_2$, ZnO, $TiO_2$. For example, the n-type layer 232 is formed using a suitable technique such as sputtering or a printing technique such as inkjet, gravure, or screen printing. In an exemplary implementation, the p-type layer 234 is formed of a metal oxide, or particles resulting from printing method followed by anneal, or organic p-type materials. An exemplary metal oxide includes NiO. An exemplary printed p-type layer 234 includes NiO particles which may be embedded in an electrically conductive matrix and/or coalesced. Exemplary organic materials include polymers such as PTAA, PEDOT:PSS and polyaniline, and small molecules such as spiro-MeOTAD and fullerenes.

In accordance with embodiments the fourth patterned line opening P4 can be formed by laser patterning to isolate individual bypass diodes. The semiconductor-based bypass layer 230 can also be patterned with a shadow mask where tolerance is large and feature size is on the order of millimeters rather than micrometers. This can allow the semiconductor-based bypass layer 230 to be deposited using similar equipment to the solar cell stack, leveraging existing equipment. Printing techniques such as inkjet, gravure, screen printing, extrusion, spraying, etc. can also be used, without requirement of separate scribing to the fourth patterned line opening P4.

Figure 8J:
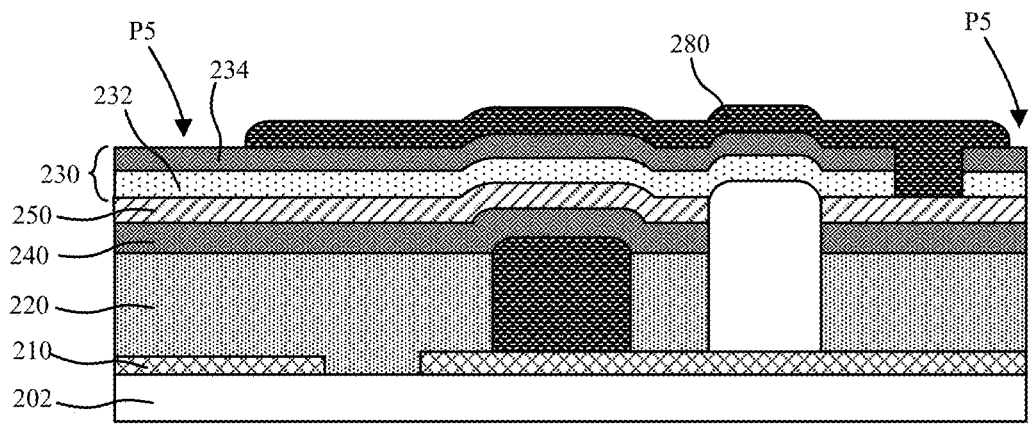

Bypass electrode layer(s) 280 are then deposited over the semiconductor-based bypass layer 230 and within the fourth patterned line opening P4 at operation 780 and as shown in FIG. 8J. The bypass electrode layers 280 can be formed using similar techniques such as the semiconductor-based bypass layer 230, and may optionally be patterned to form fifth patterned line openings P5. Similar to the fourth patterned line opening P4, the fifth patterned line openings P5 can be formed using patterning such as laser patterning, or shadow mask. Printing techniques can also be used without the requirement of separate scribing.

Referring again to FIGS. 6A-6C, the solar cell interconnect may include a bottom electrode layer 210 on a substrate 202. The bottom electrode layer includes a first bottom electrode layer 210A and a second bottom electrode layer 210B separated by a first patterned line opening P1 in the bottom electrode layer 210. A subcell layer 220 is formed over the bottom electrode layer 210, the subcell layer 220 including a first subcell layer 220A and a second subcell layer 220B separated by a second patterned line opening P2 in the subcell layer 220. A vertical interconnect 270 can be formed within the second patterning line opening P2 and, optionally, substantially fill the second patterning line opening P2. For example, a top surface of the vertical interconnect 270 can be elevated above a top surface of the subcell layer 220. Where the vertical interconnect 270 substantially, or completely, fills the second patterned line opening P2, the vertical interconnect can additionally provide step coverage for the deposition of subsequent layers. A patterned top electrode layer 250 is located over the subcell layer 220 and includes a first top electrode layer 250A over the first subcell layer 220A and a second top electrode layer 250B over the second subcell layer 220B.

Still referring to FIGS. 6A-6C, in the embodiments illustrated, a solar cell 120 diode path extends between the second bottom electrode layer 210B, through the vertical interconnect 270, to the first top electrode layer 250A, the first subcell layer 220A, and the first bottom electrode layer 210A. Furthermore, a bypass diode 300 path extends between the second top electrode layer 250B, through the bypass electrode layer 280 and the semiconductor-based bypass layer 230, and to the first top electrode layer 250A.

In an embodiment, a solar cell interconnect with bypass diode includes a bottom electrode layer 210, a first patterned line opening P1 in the bottom electrode layer, a subcell layer 220 over the bottom electrode layer 210, a second patterned line opening P2 in the subcell layer, and a top electrode layer 250 spanning over the subcell layer 220. A vertical interconnect 270 can be located in the second patterned line opening P2 to provide electrical connection between the bottom electrode layer 210 and a top electrode layer 250 of serial solar cells. The solar cell interconnect with bypass diode structure can further include a third patterned line opening P3 in the top electrode layer 250, a semiconductor-based bypass layer 230 over the top electrode layer 250 and spanning over the vertical interconnect 270, and a bypass electrode layer 280 over the semiconductor-based bypass layer 230 and in contact with the top electrode layer 250 (e.g. through the fourth patterned line opening P4). The semiconductor-based bypass layer 230 may include one or more layers. In an embodiment, the semiconductor-based bypass layer includes p-type layer 234 and an n-type layer 232 to form a bypass diode with p-n junction, though the dopants can be reversed. Alternatively, the semiconductor-based bypass layer can be a single dopant type to form a bypass diode with Schottky diode.

In accordance with embodiments, the bypass electrode layer 280 may span over a width of the vertical interconnect 270. For example, the bypass electrode layer 280 may completely cover a width of the vertical interconnect 270, with width measured in same direction as widths of the multiple patterned line openings (e.g. perpendicular to the lines). Width of the vertical interconnect 270 may corresponds to a width W1 of the second patterned line opening P2. A ratio of widths for the bypass electrode layer 280 width W3 and the second patterned line opening P2 width W1 is at least 50:1 in some embodiments, and may be larger than 100:1. These ratios may facilitate a lower current density through the bypass diodes, which further facilitates inclusion of a p-n junction. Specifically, the widths of the patterned line openings P1, P2, P3 etc. used to form the solar cell diodes may be smaller than widths of the patterned line openings P4, P5 used to form the bypass diode. Smaller widths for the solar cell diode patterned line openings may mitigate dead space. While these widths can be larger, in some embodiments they are less than 50 μm. The bypass electrode 280 on the other hand can cover a large area. For example, bypass electrode 280 may have a width W3 of 4 mm. In operation, the current density for the bypass diode can be determined by an active width W2 where the bypass electrode 280, semiconductor-based bypass layer 230, and first top electrode layer 250A overlap. In accordance with embodiments, this active width W2 may be greater than 1 mm. For example, the ratio of active width W2 to second patterned line opening P2 width W1 is 20 or more, such as 25 for a 1 mm active width W2 and 40 μm second patterned line opening P2 width W1. For example, the ratio of W2:W1 may be 20-100 or more.

In an exemplary implementation, the n-type layer 232 is formed of a metal oxide such as $SnO_2$, ZnO, $TiO_2$. For example, the n-type layer 232 is formed using a suitable technique such as sputtering or a printing technique such as inkjet, gravure, or screen printing. In an exemplary implementation, the p-type layer 234 is formed of a metal oxide, or particles resulting from printing method followed by anneal, or organic p-type materials. An exemplary metal oxide includes NiO. An exemplary printed p-type layer 234 includes NiO particles which may be embedded in an electrically conductive matrix and/or coalesced. Exemplary organic materials include polymers such as PTAA and polyaniline, and small molecules such as spiro-MeOTAD and fullerenes. In an embodiment, the bypass electrode layer 280 is formed directly on the p-type layer 234, and the bypass electrode layer incudes a material with a deep work function of −4.5 to −6 eV such as carbon, gold or silver.

The top electrode layer 250 may include a metal layer, such as Ag, Cu, Al, Au, etc. Where the subcell layer 220 includes a perovskite absorber layer, a conformal barrier layer 240 may be located between the top electrode layer 250 and the subcell layer 220. The conformal barrier layer 240 may optionally span over the vertical interconnect 270. Thus, the vertical interconnect 270 may be a discrete layer from the top electrode layer 250 and may be formed of a different material. Where the subcell layer 220 includes a perovskite absorber layer the vertical interconnect 270 may be non-reactive with the perovskite material. For example, the vertical interconnect can include conductive filler particles (e.g. metals, carbon) dispersed in a matrix (e.g. polymer). However, this is not required and the vertical interconnect can be formed of a metal layer. Furthermore, the vertical interconnect can be integrally formed with the top electrode layer.

The bypass diodes in accordance with embodiments may facilitate the use of common thin film deposition techniques such as printing techniques, sputtering, evaporation, and chemical vapor deposition, thus leveraging existing equipment used for the solar cell stack. In the exemplary embodiments illustrated in FIG. 6A-6C the semiconductor-based bypass layer 230 can be globally deposited and then patterned to form the fourth patterned line openings P4. For example, this may be accomplished using a subtractive patterning technique such as laser scribing. The larger features sizes allowed by locating the bypass diode over the subcell layer can also allow for the use of shadow masks or printed layers without the requirement for subtractive patterning. For example, the bypass electrode layer 280 can be deposited using such a technique, thus defining fifth patterned line openings P5 without subtractive patterning. In an exemplary embodiment, the bypass electrode layer is deposited by screen printing a silver paste, followed by a thermal process to drive off solution, and optionally coalesce the silver particles or reflow other materials within the paste. A variety of metal and carbon materials can be used to form the bypass electrode layer 280, which may include a polymer matrix. In such embodiments, the fourth and fifth patterned line openings can have larger widths, such as 150 μm or more.

FIG. 9 is a schematic cross-sectional side view illustration of a solar cell interconnect with bypass diode with a metal vertical interconnect and without a fourth patterned line opening P4 scribe in accordance with an embodiment. The embodiment illustrated in FIG. 9 illustrates multiple variations that can be made independently or in combination with the embodiments of FIGS. 6A-6C. Compared to the embodiments of FIGS. 6A-6C, one difference of the embodiment illustrated in FIG. 9 is that the fourth patterned line opening P4 is not formed using a subtractive patterning technique. Instead the opening may be larger, and defined during deposition, such as with shadow masks or printing techniques. Such a modification can also be made to the embodiments illustrated in FIG. 6A-6C. Similarly the fifth patterned line opening P5 can be defined using a shadow mask or printing technique during deposition of the bypass electrode layer 280. Another illustrated difference is that the vertical interconnect 270 and the top electrode layer 250 can be integrally formed, that is, of the same layer. For example, the vertical interconnect can be formed of the same metal layer forming the top electrode layer. Alternatively, the vertical interconnect 270 can still be a separate, discrete layer from the top electrode layer 250, but also formed of a metal layer that can be the same or different than the top electrode layer 250 material. In either configuration, the conformal barrier layer 240 can span over the subcell layer 220 and within the second patterned line opening P2, in particular where the subcell layer 220 includes a perovskite material. Such a modification can also be made to the embodiment illustrated in FIGS. 6A-6C.

Yet another variation illustrated in FIG. 10 is similar to that illustrated in FIG. 9, however with tighter patterning of the fourth patterned line opening P4. In this case, the bypass electrode 280 can partially or fully fill the fourth patterned line opening P4.

Figure 11:
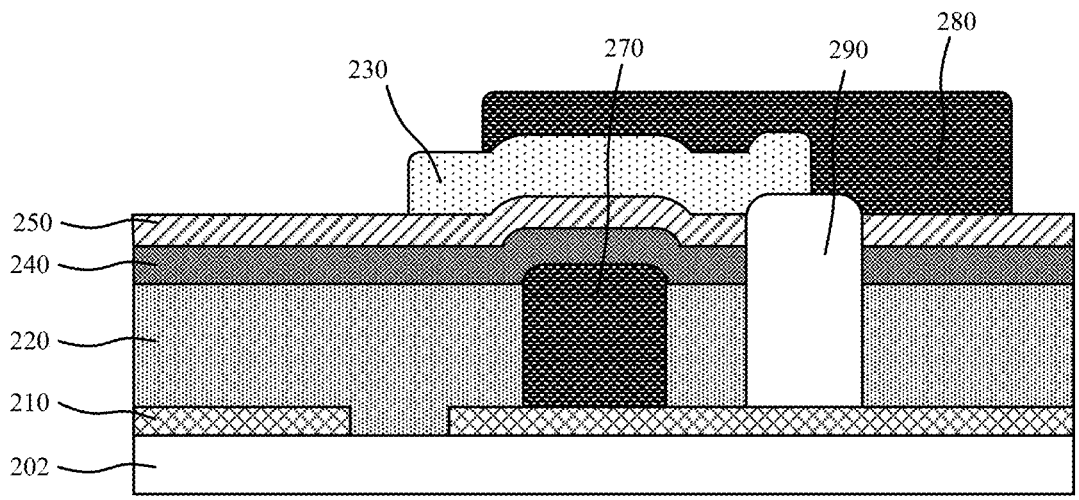
FIG. 11 is a schematic cross-sectional side view illustration of a solar cell interconnect with Schottky bypass diode in accordance with an embodiment.

Up until this point, various solar sell interconnect and bypass diode configurations have been described and illustrated with regard to a bypass diode including a p-n junction, however embodiments are not necessarily so limited and may also be implemented with other bypass diode configurations including a Schottky bypass diode. FIG. 11 is a schematic cross-sectional side view illustration of a solar cell interconnect with Schottky bypass diode in accordance with an embodiment. The solar cell interconnect structure of FIG. 11 remains substantially similar to the solar cell interconnects previously described, with a difference being in the fabrication of the Schottky bypass diode. In the illustrated embodiment the semiconductor-based bypass layer 230 is illustrated as a single layer. In accordance with embodiments, the semiconductor-based bypass layer 230 may include a single dopant type, though may include one or more layers. The semiconductor-based bypass layer 230 may be n-type or p-type depending upon application. Furthermore, the semiconductor-based bypass layer 230 and the bypass electrode layer 280 may be formed by deposition and subtractive patterning, or using suitable deposition techniques without subtractive patterning.

In an embodiment in which the semiconductor-based bypass layer 230 is n-type, the bypass electrode layer 280 may have a deep work function (e.g. −4.5 to −6 eV, inclusive of carbon and metals such as gold, and silver as minimum work function). Conversely, where the semiconductor-based bypass layer 230 is p-type, the bypass electrode layer 280 may have a shallow work function (e.g. between −2 and −4.5 eV, including aluminum). In an embodiment, bypass electrode layer 280 is formed of carbon particles (e.g. carbon black), or a carbon/polymer blend. In an embodiment, the bypass electrode layer 280 is formed of a material with an opposite charge transport type than the semiconductor-based bypass layer 230 so as to create a diode.

In utilizing the various aspects of the embodiments, it would become apparent to one skilled in the art that combinations or variations of the above embodiments are possible for forming a solar cell module and solar cell interconnects with integrated bypass diodes. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell interconnect with bypass diode comprising:
    a bottom electrode layer;
    a first patterned line opening in the bottom electrode layer;
    a subcell layer over the bottom electrode layer;
    a second patterned line opening in the subcell layer;
    a top electrode layer spanning over the subcell layer;
    and a vertical interconnect within the second patterned line opening to provide electrical connection between the bottom electrode layer and the top electrode layer;
    a third patterned line opening that extends through the top electrode layer and the subcell layer;
    an insulating fill material that substantially fills the third patterned line opening;
    a semiconductor-based bypass layer over the top electrode layer and spanning over the vertical interconnect and the insulating fill material; and
    a bypass electrode layer over the semiconductor-based bypass layer and in contact with the top electrode layer.

2. The solar cell interconnect with bypass diode of claim 1, wherein the semiconductor-based bypass layer includes a p-type layer and an n-type layer.

3. The solar cell interconnect with bypass diode of claim 2, wherein the bypass electrode layer spans over a width of the vertical interconnect.

4. The solar cell interconnect with bypass diode of claim 3, wherein a ratio of widths for the bypass electrode layer and the second patterned line opening is at least 50:1.

5. The solar cell interconnect with bypass diode of claim 2, wherein the top electrode layer comprises a metal layer.

6. The solar cell interconnect with bypass diode of claim 5, further comprising a conformal barrier layer between the top electrode layer and the subcell layer.

7. The solar cell interconnect with bypass diode of claim 6, wherein the subcell layer includes a perovskite absorber layer.

8. The solar cell interconnect with bypass diode of claim 7, wherein the conformal barrier layer spans over the vertical interconnect.

9. The solar cell interconnect of claim 8, wherein the vertical interconnect substantially fills the second patterned line opening.

10. The solar cell interconnect with bypass diode of claim 8, wherein the vertical interconnect comprises conductive filler particles dispersed in a matrix.

11. The solar cell interconnect with bypass diode of claim 10, wherein the conductive filler particles comprise carbon.

12. The solar cell interconnect with bypass diode of claim 7, wherein the conformal barrier layer spans over the subcell layer and within the second patterned line opening.

13. The solar cell interconnect with bypass diode of claim 12, wherein the vertical interconnect and the top electrode layer are integrally formed.

14. The solar cell interconnect with bypass diode of claim 13, wherein the vertical interconnect substantially fills the second patterned line opening.

15. The solar cell interconnect with bypass diode of claim 2, wherein the p-type layer comprises a material selected from the group consisting of NiO and an organic p-type material.

16. The solar cell interconnect with bypass diode of claim 15, wherein the n-type layer comprises a material selected from the group consisting of $SnO_2$, ZnO and $TiO_2$.

17. The solar cell interconnect with bypass diode of claim 2, wherein:
    the bypass electrode layer is formed directly on the p-type layer of the semiconductor-based bypass layer; and
    the bypass electrode layer comprises a material with a deep work function of −4.5 to −6 eV selected from the group consisting of carbon, gold and silver.

18. The solar cell interconnect with bypass diode of claim 2, wherein the n-type layer is a metal oxide and the p-type layer is an organic semiconductor or metal oxide.

19. The solar cell interconnect with bypass diode of claim 2, wherein:
    the top electrode layer includes a first top electrode layer of a first solar cell and a second top electrode layer of a second solar cell;
    wherein the bypass electrode, the semiconductor-based bypass layer, and the first top electrode layer overlap with an active width W2; and
    wherein a ratio of the active width W2 to a width W1 of the second patterned line opening is at least 20.

20. The solar cell interconnect with bypass diode of claim 1, wherein the semiconductor-based bypass layer is a single layer.

21. The solar cell interconnect with bypass diode of claim 20, wherein the semiconductor-based bypass layer is n-type, and the bypass electrode layer comprises a material with a deep work function of −4.5 to −6 eV selected from the group consisting of carbon, gold and silver.

* * * * *